US012532696B2

(12) United States Patent
Tanabe et al.

(10) Patent No.: US 12,532,696 B2
(45) Date of Patent: Jan. 20, 2026

(54) SUBSTRATE PROCESSING METHOD AND SUBSTRATE PROCESSING DEVICE

(71) Applicant: Kioxia Corporation, Tokyo (JP)

(72) Inventors: Mana Tanabe, Tokyo (JP); Kaori Umezawa, Fujisawa Kanagawa (JP); Kosuke Takai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 34 days.

(21) Appl. No.: 18/333,572

(22) Filed: Jun. 13, 2023

(65) Prior Publication Data

US 2024/0096652 A1 Mar. 21, 2024

(30) Foreign Application Priority Data

Sep. 21, 2022 (JP) .................................. 2022-150551

(51) Int. Cl.
*H01L 21/67* (2006.01)
*H01L 21/687* (2006.01)

(52) U.S. Cl.
CPC .. *H01L 21/67051* (2013.01); *H01L 21/67034* (2013.01); *H01L 21/67109* (2013.01); *H01L 21/67248* (2013.01); *H01L 21/68764* (2013.01)

(58) Field of Classification Search
CPC ......... H01L 21/67051; H01L 21/67034; H01L 21/67109; H01L 21/68764
See application file for complete search history.

(56) References Cited

U.S. PATENT DOCUMENTS

| 10,734,217 | B2 | 8/2020 | Kamiya et al. |
| 2014/0273499 | A1* | 9/2014 | Huang .................... G03F 7/42 |
| | | | 156/345.21 |
| 2017/0274427 | A1* | 9/2017 | Sakurai ............ H01L 21/67057 |
| 2019/0146345 | A1* | 5/2019 | Takahashi ........... H01L 21/6715 |
| | | | 427/240 |
| 2021/0276055 | A1 | 9/2021 | Nakamura et al. |
| 2021/0299713 | A1 | 9/2021 | Demura et al. |
| 2021/0323036 | A1 | 10/2021 | Matsushima et al. |
| 2022/0068671 | A1 | 3/2022 | Demura et al. |

FOREIGN PATENT DOCUMENTS

| JP | 2005307311 A | * 11/2005 | ......... C23C 18/1632 |
| JP | 2008130951 A | 6/2008 | |
| JP | 2012156464 A | 8/2012 | |
| JP | 2018026436 A | 2/2018 | |

(Continued)

OTHER PUBLICATIONS

Machine translation: JP-2005307311; Kaneko et al. (Year: 2005).*
Machine translation: KR20200050259; Lee et el. (Year: 2020).*

*Primary Examiner* — Natasha N Campbell
(74) *Attorney, Agent, or Firm* — Holtz, Holtz & Volek PC

(57) ABSTRACT

According to an embodiment, a substrate processing method includes forming a liquid film on a substrate including a first region provided with a first film on an outermost surface thereof and a second region provided with a second film on an outermost surface thereof, the first film and the second film being different from each other in material. The method further includes forming a solidified film by solidifying the liquid film. The method further includes causing the solidified film on the first region to melt prior to the solidified film on the second region.

11 Claims, 24 Drawing Sheets

(56) References Cited

FOREIGN PATENT DOCUMENTS

| | | | | |
|---|---|---|---|---|
| JP | 2021163956 A | | 10/2021 | |
| JP | 2022007972 A | | 1/2022 | |
| JP | 2022008040 A | | 1/2022 | |
| JP | 2022041883 A | | 3/2022 | |
| KR | 2020050259 A | * | 5/2020 | ....... H01L 21/67051 |
| WO | 2020012959 A1 | | 1/2020 | |

* cited by examiner

SUBSTRATE PROCESSING METHOD AND SUBSTRATE PROCESSING DEVICE

CROSS REFERENCE TO RELATED APPLICATIONS

This application is based upon and claims the benefit of priority from the prior Japanese Patent Application No. 2022-150551, filed on Sep. 21, 2022, the entire contents of which are incorporated herein by reference.

FIELD

The embodiments of the present invention relate to a substrate processing method and a substrate processing device.

BACKGROUND

In freeze cleaning that freezes a cleaning liquid supplied on a substrate for photomasks to remove foreign matters from the substrate, a defect in which the substrate is partially oxidized may be generated.

DETAILED DESCRIPTION

According to an embodiment, a substrate processing method includes forming a liquid film on a substrate including a first region provided with a first film on an outermost surface thereof and a second region provided with a second film on an outermost surface thereof, the first film and the second film being different from each other in material. The method further includes forming a solidified film by solidifying the liquid film. The method further includes causing the solidified film on the first region to melt prior to the solidified film on the second region.

Embodiments of the present invention will now be explained below with reference to the drawings. The present invention is not limited to the embodiments.

First Embodiment

Figure 1:
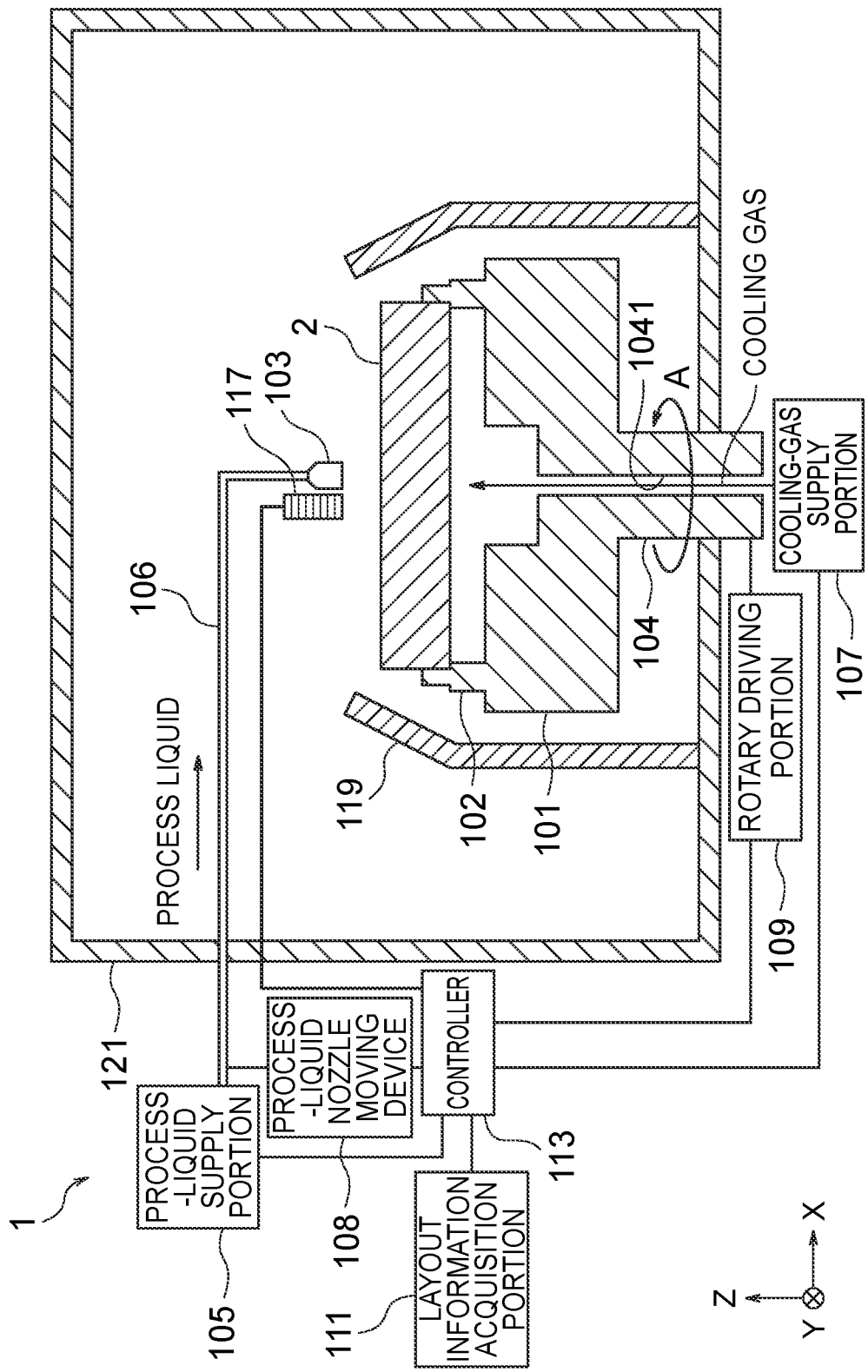
FIG. 1 is a diagram illustrating an example of a substrate processing device according to a first embodiment.

FIG. 1 is a diagram illustrating an example of a substrate processing device 1 according to a first embodiment. In the present specification, the vertical direction is defined as a Z-axis direction; a direction along the horizontal direction is defined as an X-axis direction; and the direction that is along the horizontal direction and perpendicular to the X-axis direction is defined as a Y-axis direction. Further, in the present specification, the upward direction refers to a positive Z-axis direction, and the downward direction refers to a negative Z-axis direction. The substrate processing device 1 is configured to be able to perform freeze cleaning that removes foreign matters from a substrate 2 for photomasks by freezing a cleaning liquid supplied on the substrate 2. Specifically, the substrate processing device 1 includes a stage 101, a process liquid nozzle 103, a process-liquid supply portion 105, a cooling-gas supply portion 107, a process-liquid nozzle moving device 108, a rotary driving portion 109, a layout information acquisition portion 111, a controller 113, a temperature sensor 117, a cup 119, and a housing 121.

Figure 2:
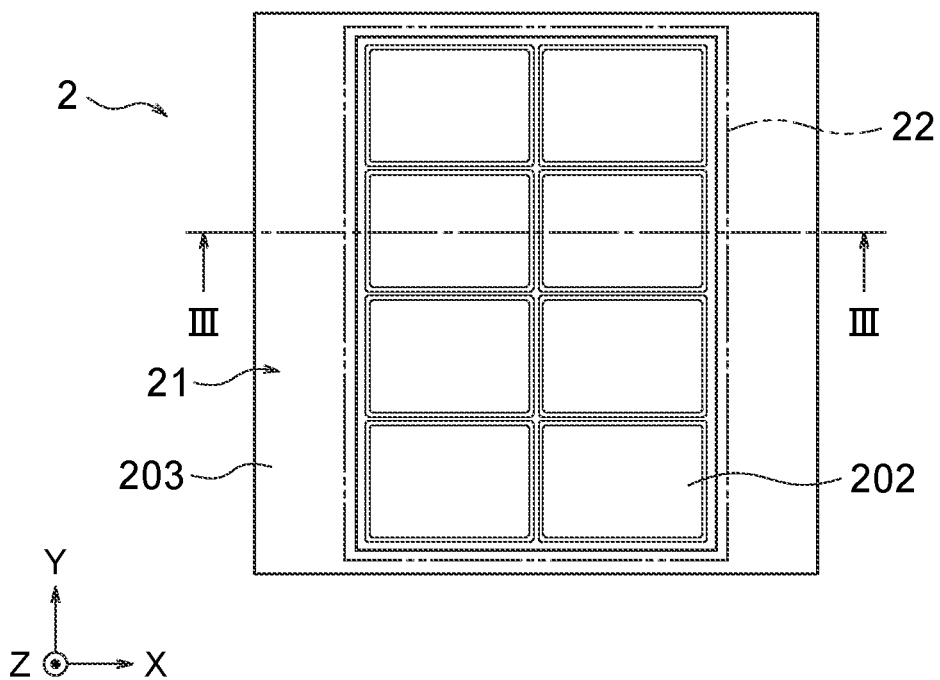
FIG. 2 is a plan view illustrating an example of a substrate to be processed by the substrate processing device according to the first embodiment.
Figure 3:
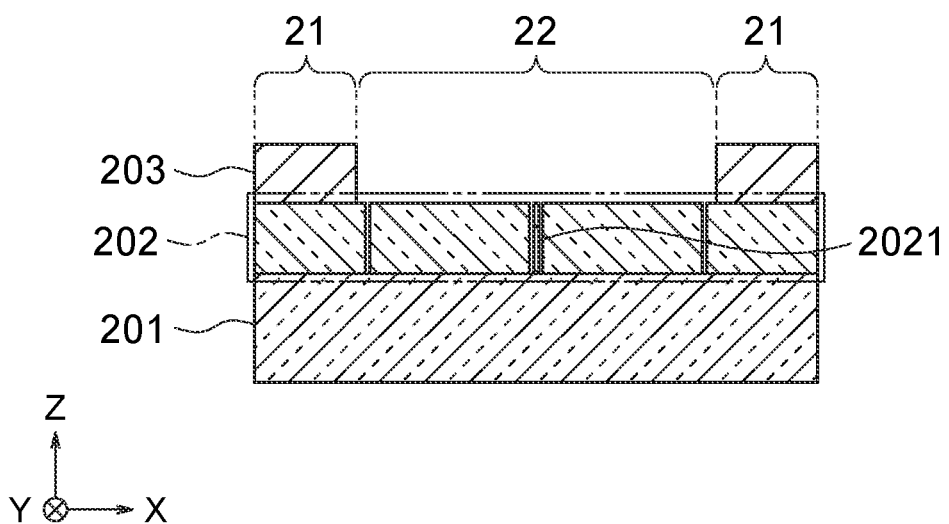
FIG. 3 is a cross-sectional view illustrating the example of the substrate to be processed by the substrate processing device according to the first embodiment.

The substrate 2 is described prior to detailed descriptions of the substrate processing device 1. FIG. 2 is a plan view illustrating an example of the substrate 2 to be processed by the substrate processing device 1 according to the first embodiment. FIG. 3 is a cross-sectional view illustrating the example of the substrate 2 to be processed by the substrate processing device 1 according to the first embodiment. FIG. 3 illustrates a cross-section taken along a line III-III in FIG. 2. In the example illustrated in FIGS. 2 and 3, the substrate 2 is for a halftone phase shift mask that attenuates the intensity of transmitted light and improves a pattern resolution by using a phase shift that reverses the phase by 180°. The substrate 2 may be for a photomask other than the halftone phase shift mask.

As illustrated in FIGS. 2 and 3, the substrate 2 has a first substrate region 21 provided with a light shielding film 203 on its outermost surface and a second substrate region 22 provided with a halftone film 202 on its outermost surface, the halftone film 202 being different from the light shielding film 203 in material. In the example illustrated in FIG. 2, the first substrate region 21 is a region of the substrate 2 closer to the outer periphery (that is, a peripheral region). The second substrate region 22 is a central region of the substrate 2. In more detail, the second substrate region 22 is a region having a rectangular shape in plan view in the example illustrated in FIG. 2. The first substrate region 21 is a region surrounding the second substrate region 22 and having a rectangular frame shape in plan view.

More specifically, the substrate 2 includes a quartz substrate 201, the halftone film 202, and the light shielding film 203. The quartz substrate 201 has a rectangular shape in plan view. The quartz substrate 201 contains quartz (Qz). The halftone film 202 is formed on a surface (that is, a top surface) of the quartz substrate 201. The halftone film 202 contains at least silicon (Si), for example, and may further contain molybdenum (Mo) or nitrogen (N). The halftone film 202 contains, for example, molybdenum silicide (MoSi). The halftone film 202 reverses the phase of light transmitted therethrough by 180° with respect to a portion where the halftone film 202 is not present and the quartz substrate 201 is exposed. The halftone film 202 in the second substrate region 22 is sectioned into a plurality of regions via dicing lines 2021, in which different patterns (not illustrated) may be formed, respectively, or identical patterns may be formed. The light shielding film 203 is formed on the surface of the halftone film 202 in the first substrate region 21, for example. The light shielding film 203 is not formed on the surface of the halftone film 202 in the second substrate region 22, for example. In this case, the first substrate region 21 has the light shielding film 203 on its outermost surface, and the second substrate region 22 has the halftone film 202 on its outermost surface. The light shielding film 203 has a rectangular frame shape in plan view. The light shielding film 203 contains chromium (Cr). The light shielding film 203 shields light. The first substrate region 21 may be a region where a film (e.g., an alignment mark) other than the light shielding film 203, the area ratio of which is significantly less than that of the light shielding film 203, is provided in a part of the light shielding film 203 in its outermost surface.

Next, the substrate processing device 1 is described in detail. As illustrated in FIG. 1, the stage 101 is arranged in the housing 121, on which the substrate 2 can be placed. In FIG. 1, the substrate 2 is illustrated in a simplified manner. The stage 101 holds the substrate 2 placed thereon.

Specifically, as illustrated in FIG. 1, the stage 101 is formed in a circular plate shape and has a horizontal surface. Four substrate support pins 102 are arranged on an outer peripheral edge of the surface of the stage 101 so as to respectively correspond to four corners of the rectangular substrate 2. The substrate support pins 102 support the four corners of the substrate 2, thereby horizontally supporting the substrate 2 on the stage 101. The substrate support pins 102 are conductive so as to be able to efficiently neutralize static electricity of the light shielding film 203. The substrate support pins 102 may be made of conductive PEEK (polyetheretherketone), for example.

More specifically, the stage 101 is fixed at an upper end of a rotation shaft 104 extending in the vertical direction (Z-axis direction) concentrically with the rotation shaft 104. The stage 101 can rotate about the rotation shaft 104, for example, in the direction indicated with an arrow A in FIG. 1. The rotary driving portion 109 is connected to the rotation shaft 104. The rotary driving portion 109 includes, for example, an actuator such as a motor. The rotary driving portion 109 drives and rotates the rotation shaft 104 and the stage 101 on the rotation shaft 104 under control by the controller 113. By driving and rotating the stage 101, formation of a liquid film of a cleaning liquid can be promoted on the outermost surface of the substrate 2 described later.

As illustrated in FIG. 1, the cup 119 that is concentric with the stage 101 and substantially cylindrical is provided to surround the stage 101. An upper end of the cup 119 is at a level higher than the surface of the substrate 2. The cup 119 prevents a cleaning liquid on the surface of the substrate 2 from being scattered therearound by rotation of the stage 101 in freeze cleaning.

The process liquid nozzle 103 is configured to form a liquid film of a process liquid on the substrate 2 (that is, on the outermost surface of the substrate 2). The process liquid is, for example, pure water. Specifically, the process liquid nozzle 103 is connected to the process-liquid supply portion 105 via a supply pipe 106. The process-liquid supply portion 105 supplies the process liquid to the process liquid nozzle 103 via the supply pipe 106. The process-liquid supply portion 105 includes, for example, a reservoir tank that stores the process liquid therein, a pump that supplies the process liquid from the reservoir tank to the process liquid nozzle 103, and a valve that adjusts the flow rate of the supplied process liquid. The controller 113 controls the flow rate of the process liquid supplied by the process-liquid supply portion 105. The process liquid nozzle 103 discharges the process liquid supplied by the process-liquid supply portion 105 on the substrate 2, thereby forming the liquid film of the process liquid on the substrate 2.

The process-liquid nozzle moving device 108 is connected to the process liquid nozzle 103. The process-liquid nozzle moving device 108 moves the process liquid nozzle 103 from a standby position to a process-liquid discharge position for liquid film formation (hereinafter, a second discharge position), for example, under control by the controller 113. The second discharge position is, for example, a position facing the center of rotation of the substrate 2 in the second substrate region 22. By discharging the process liquid at the position facing the center of rotation of the substrate 2, formation of the liquid film in association with rotation of the substrate 2 can be further promoted. The process-liquid nozzle moving device 108 may include, for example, an arm connected to the process liquid nozzle 103 and a driving source connected to the arm, such as a motor.

The cooling-gas supply portion 107 is configured to solidify the liquid film of the process liquid formed on the substrate 2 to form a solidified film. The solidified film is, for example, ice obtained by freezing pure water. Specifically, the cooling-gas supply portion 107 supplies a cooling gas to the back of the substrate 2 through a cooling gas nozzle 1041 vertically penetrating through the central portion of the rotation shaft 104. The cooling gas is, for example, nitrogen ($N_2$) gas. The cooling-gas supply portion 107 includes, for example, a reservoir tank storing therein the cooling gas that is liquefied and a valve adjusting the flow rate of the cooling gas supplied from the reservoir tank to the cooling gas nozzle 1041. The controller 113 controls the flow rate of the cooling gas supplied by the cooling-gas supply portion 107. For example, the controller 113 continues to supply the cooling gas until the solidified film is formed based on the temperature of the substrate 2 measured by the temperature sensor 117 provided on the process liquid nozzle 103. The cooling gas nozzle 1041 discharges the cooling gas supplied from the cooling-gas supply portion 107 to the back of the substrate 2, thereby solidifying the liquid film of the process liquid formed on the substrate 2 to form the solidified film. By forming the solidified film, it is possible to cause foreign matters adhering to the surface of the substrate 2 to float (separate) off the surface due to volumetric expansion caused by change of the process liquid from a liquid phase to a solid phase. By causing the foreign matters to float, the foreign matters can be effectively removed from the substrate 2 after a solidified film 204 melts. Further, even in a case where the critical dimension (CD) of a pattern formed in the halftone film 202 is small, such freeze cleaning can appropriately remove the foreign matters while preventing pattern collapse and change of optical properties.

The process liquid nozzle 103 is configured to cause the solidified film on the first substrate region 21 to melt (or to dissolve it in the supplied process liquid) prior to the solidified film on the second substrate region 22. Specifically, after the solidified film is formed on the substrate 2, the process-liquid nozzle moving device 108 moves the process liquid nozzle 103 to a discharge position facing the first substrate region 21 (hereinafter, a first discharge position) under control by the controller 113. The process liquid nozzle 103 discharges the process liquid supplied from the process-liquid supply portion 105 from the first discharge position to the first substrate region 21, thereby causing the solidified film on the first substrate region 21 to melt. By causing the solidified film on the first substrate region 21 to melt while rotating the stage 101, the solidified film that has melted and the process liquid are swept out to outside of the substrate 2 together with foreign matters and electric charges on the surface of the light shielding film 203. Consequently, the foreign matters in the first substrate region 21 can be removed, and static electricity of the light shielding film 203 can be neutralized. Since the substrate support pins 102 are conductive, static electricity of the light shielding film 203 can be neutralized more effectively. Neutralizing static electricity of the light shielding film 203 can reduce a potential difference between the light shielding film 203 in the first substrate region 21 and the halftone film 202 in the second substrate region 22, generated when the solidified film is formed, although the details will be described later. By reducing the potential difference, generation of defects like white haze caused by partial oxidation of the outermost surface of the halftone film 202 can be reduced. In the defects like white haze, the amount of reflected light is different from that in other portions of the outermost surface of the halftone film 202 and is, for example, reduced.

After the solidified film on the first substrate region 21 has melted, the process-liquid nozzle moving device 108 moves the process liquid nozzle 103 to the second discharge position again under control by the controller 113. The process liquid nozzle 103 discharges the process liquid supplied from the process-liquid supply portion 105 from the second discharge position to the second substrate region 22, thereby causing the solidified film on the second substrate region 22 to melt. By causing the solidified film on the second substrate region 22 to melt while rotating the stage 101, foreign matters having floated off the substrate due to the solidified film are swept out to the outside the substrate 2, together with a melt of the solidified film and the supplied process liquid. Consequently, the foreign matters in the second substrate region 22 can be removed.

The layout information acquisition portion 111 acquires layout information on the substrate 2. For example, the layout information acquisition portion 111 acquires layout information input by an input operation by a user via an input interface. The controller 113 controls supply of a process liquid by the process liquid nozzle 103 based on the layout information acquired by the layout information acquisition portion 111. Specifically, the controller 113 acquires the position (i.e., the coordinates) of the first substrate region 21 based on the layout information. When the solidified film on the first substrate region 21 is caused to melt, the controller 113 controls the process-liquid nozzle moving device 108 to move the process liquid nozzle 103 to the first discharge position facing the first substrate region 21 based on the acquired position of the first substrate region 21. Use of the layout information enables the solidified film on the first substrate region 21 to melt in a simple and appropriate manner. The layout information acquisition portion 111 and the controller 113 can be configured by, for example, a processor that executes a program stored in a memory.

Figure 4:
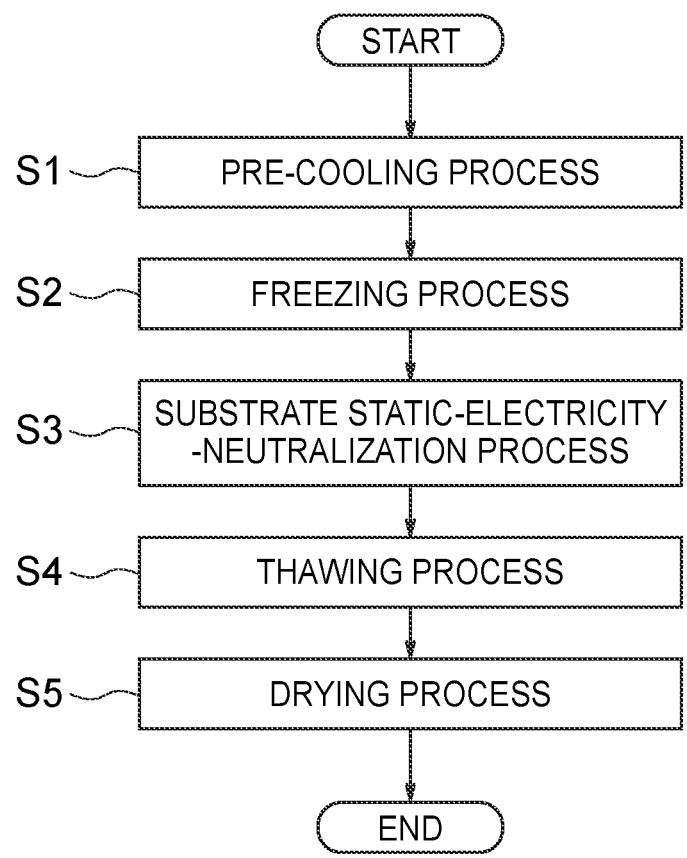
FIG. 4 is a flowchart illustrating an operation example of the substrate processing device according to the first embodiment.
Figure 5:
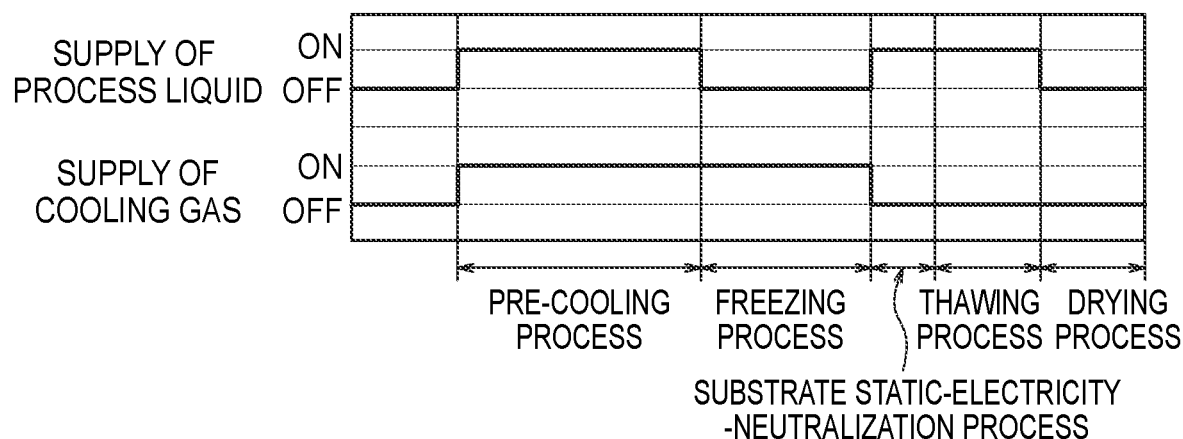
FIG. 5 is a timing chart illustrating the operation example of the substrate processing device according to the first embodiment.
Figure 6:
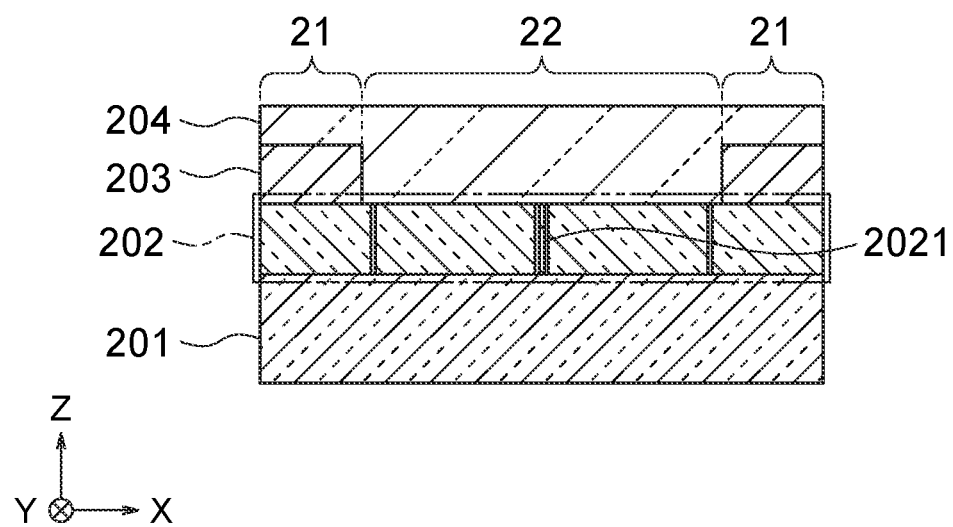
FIG. 6 is a cross-sectional view of a part of the substrate processing device according to the first embodiment, illustrating the operation example of the substrate processing device.
Figure 7:
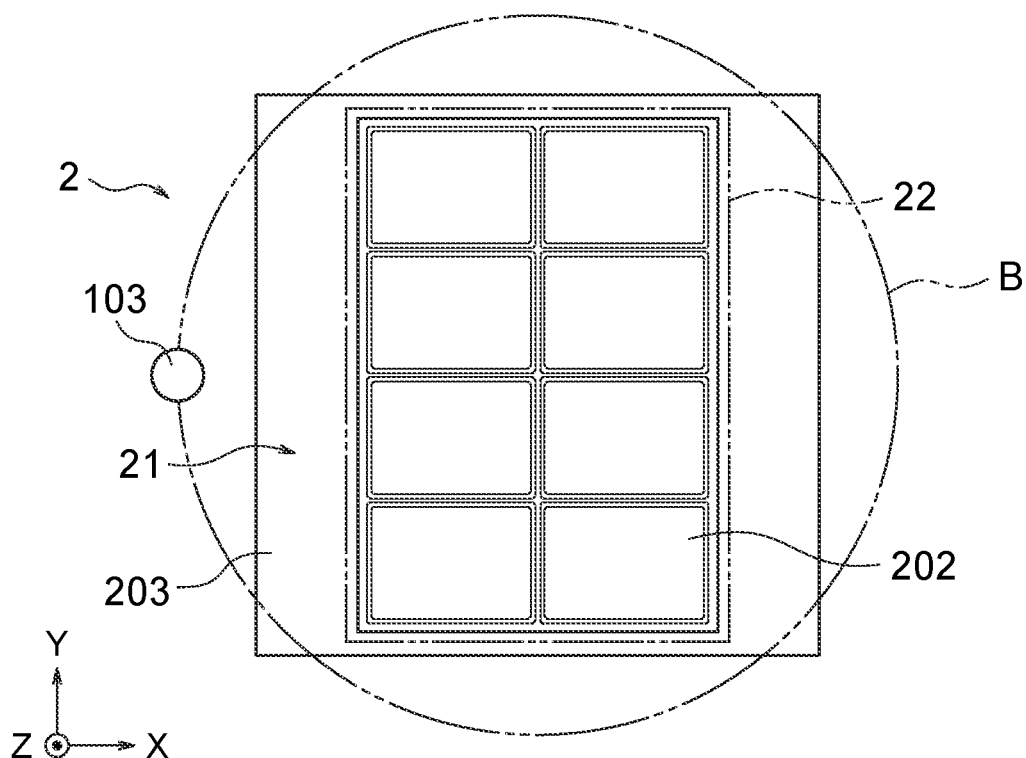
FIG. 7 is a plan view of a part of the substrate processing device according to the first embodiment, illustrating the operation example of the substrate processing device.
Figure 8:
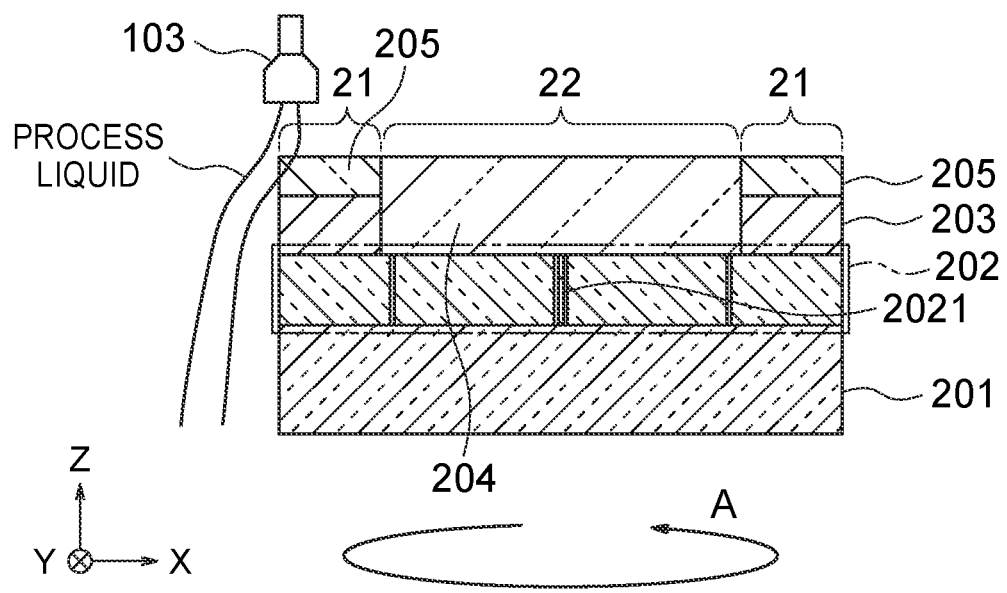
FIG. 8 is a cross-sectional view of a part of the substrate processing device according to the first embodiment, illustrating the operation example of the substrate processing device, in continuation from FIG. 6.

Next, an operation example of the substrate processing device 1 as an example of a substrate processing method of the first embodiment is described with reference to FIGS. 4 to 8. FIG. 4 is a flowchart illustrating the operation example of the substrate processing device 1 according to the first embodiment. FIG. 5 is a timing chart illustrating the operation example of the substrate processing device 1 according to the first embodiment. FIG. 6 is a cross-sectional view of a part of the substrate processing device 1 according to the first embodiment, illustrating the operation example of the substrate processing device 1. FIG. 7 is a plan view of a part of the substrate processing device 1 according to the first embodiment, illustrating the operation example of the substrate processing device 1. FIG. 8 is a cross-sectional view of a part of the substrate processing device 1 according to the first embodiment, illustrating the operation example of the substrate processing device 1, in continuation from FIG. 6.

First, as illustrated in FIG. 4, the substrate processing device 1 performs a pre-cooling process of forming a liquid film of a process liquid on the substrate 2 (Step S1). In the pre-cooling process, as illustrated in FIG. 5, the controller 113 causes the process-liquid supply portion 105 to supply the process liquid (ON), thereby causing the process liquid supplied by the process-liquid supply portion 105 to be discharged on the substrate 2 from the process liquid nozzle 103 arranged at the second discharge position. At this time, the controller 113 causes the rotary driving portion 109 to rotate the stage 101. Further, in the pre-cooling process, as illustrated in FIG. 5, the controller 113 causes the cooling-gas supply portion 107 to supply a cooling gas (ON), thereby causing the cooling gas supplied by the cooling-gas supply portion 107 to be discharged to the back of the substrate 2 from the cooling gas nozzle 1041. Consequently, the liquid film of the process liquid is formed on the substrate 2 and is cooled.

After the pre-cooling process, as illustrated in FIG. 4, the substrate processing device 1 performs a freezing process of solidifying the liquid film of the process liquid (Step S2). In the freezing process, as illustrated in FIG. 5, the controller 113 causes the process-liquid supply portion 105 to stop supply of the process liquid (OFF). Further, in the freezing process, as illustrated in FIG. 5, the controller 113 causes the cooling-gas supply portion 107 to continue to supply the cooling gas (ON). With the freezing process, as illustrated in FIG. 6, the solidified film 204 (that is, an ice film) obtained by solidifying the liquid film of the process liquid is formed on the substrate 2.

After the freezing process, as illustrated in FIG. 4, the substrate processing device 1 performs a substrate static-electricity-neutralization process of neutralizing static electricity of the light shielding film 203 of the substrate 2 (Step S3). In the substrate static-electricity-neutralization process, as illustrated in FIG. 7, the controller 113 causes the process-liquid nozzle moving device 108 to move the process liquid nozzle 103 to the first discharge position on an orbit B of rotation of the first substrate region 21. The controller 113 then causes the process-liquid supply portion 105 to supply the process liquid (ON), thereby causing the process liquid supplied by the process-liquid supply portion 105 to be discharged to the solidified film 204 on the first substrate region 21 from the process liquid nozzle 103 arranged at the first discharge position as illustrated in FIG. 5. At this time, the controller 113 causes the rotary driving portion 109 to rotate the stage 101, as indicated with the arrow A in FIG. 8. Further, as illustrated in FIG. 5, the controller 113 causes the cooling-gas supply portion 107 to stop supply of the cooling gas (OFF). With the substrate static-electricity-neutralization process, as illustrated in FIG. 8, the solidified film 204 on the first substrate region 21 melts and turns into a melt 205, while the solidified film 204 on the second substrate region 22 remains solidified. A mixture liquid including the melt 205 and the supplied process liquid contains foreign matters in the first substrate region 21 and electric charges on the light shielding film 203. The mixture liquid containing the foreign matters and the electric charges is swept out to the outside of the substrate 2 by a rotational force generated by rotation of the stage 101. Consequently, the foreign matters in the first substrate region 21 can be removed, and static electricity of the light shielding film 203 can be neutralized.

After the substrate static-electricity-neutralization process, as illustrated in FIG. 4, the substrate processing device 1 performs a thawing process of thawing the solidified film 204 on the second substrate region 22 (Step S4). In the thawing process, the controller 113 causes the process-liquid nozzle moving device 108 to move the process liquid nozzle 103 to the second discharge position facing the center of rotation of the substrate 2. The controller 113 then causes the process-liquid supply portion 105 to supply the process liquid (ON), thereby causing the process liquid supplied by the process-liquid supply portion 105 to be discharged to the solidified film 204 on the second substrate region 22 from the process liquid nozzle 103 arranged at the second discharge position as illustrated in FIG. 5. At this time, the controller 113 causes the rotary driving portion 109 to rotate the stage 101. Further, as illustrated in FIG. 5, the controller 113 causes the cooling-gas supply portion 107 to continue to stop supplying the cooling gas (OFF). A time during which the process liquid is supplied in the thawing process is longer than, for example, a time during which the process liquid is supplied in the substrate static-electricity-neutralization process. With the thawing process, the solidified film 204 on the second substrate region 22 melts and turns into a melt. A mixture liquid including the melt and the supplied process liquid contains foreign matters in the second substrate region 22. The mixture liquid containing the foreign matters is swept out to the outside of the substrate 2 by the rotational force generated by rotation of the stage 101. Consequently, the foreign matters in the second substrate region 22 can be removed.

As illustrated in FIG. 4, after the thawing process, the substrate processing device 1 performs a drying process of drying the substrate 2 (Step S5). As illustrated in FIG. 5, in the drying process, the controller 113 causes the process-liquid supply portion 105 to stop supply of the process liquid (OFF) and causes the cooling-gas supply portion 107 to continue to stop supplying the cooling gas (OFF). Further, in the drying process, the controller 113 causes the rotary driving portion 109 to rotate the stage 101 at higher speed than in the other processes. By rotating the stage 101 at high speed, the substrate 2 can be dried quickly.

In the freezing process, the liquid film of the process liquid formed on the substrate 2 is changed to the solidified film (ice film) 204 from the central portion of the substrate 2 toward the outer periphery by discharge of the cooling gas from the cooling gas nozzle 1041 arranged below the central portion of the substrate 2. In general, when a liquid is frozen, a charging phenomenon occurs due to a difference of mobility between positive ions and negative ions. In a case of water, freeze is completed in a state where the outer side of a water molecule is positively charged and the inner side is negatively charged, due to polarization. When formation of the solidified film 204 progresses from the central portion of the substrate 2 toward the outer periphery, electron transfer partially occurs, so that a potential difference is generated between the halftone film 202 closer to the center and the light shielding film 203 closer to the outer periphery. Formation of the solidified film 204 is then completed with the potential difference generated. If the solidified film 204 on the first substrate region 21 (that is, on the light shielding film 203) and the solidified film 204 on the second substrate region 22 (that is, on the halftone film 202) are caused to melt at the same time, the halftone film 202 may be oxidized partially because of the potential difference between the light shielding film 203 and the halftone film 202. Unusual oxidation of the halftone film 202 causes a defect like white haze.

Meanwhile, according to the first embodiment, the solidified film 204 on the first substrate region 21 is caused to melt prior to the solidified film 204 on the second substrate region 22, as described above. Consequently, the solidified film 204 on the second substrate region 22 can be caused to melt after static electricity of the light shielding film 203 located in the first substrate region 21 is neutralized and the potential difference is reduced. Therefore, defects caused by partial oxidation of the halftone film 202 located in the second substrate region 22 can be reduced.

Further, according to the first embodiment, the process liquid having a temperature equal to or higher than the melting point of the solidified film 204 on the first substrate region 21 can be supplied to the solidified film 204 on the first substrate region 21 based on the position of the first substrate region 21 acquired in advance based on the layout information. Accordingly, defects caused by partial oxidation of the halftone film 202 can be reduced in a simple and reliable manner.

Although the example in which static electricity of the light shielding film 203 arranged on the outer peripheral region of the substrate 2 can be neutralized effectively has been described above, the first embodiment may be applied in order to neutralize static electricity of a light shielding film arranged in a central region of the substrate 2. Further, a nozzle for discharging a process liquid at the first discharge position and a nozzle for discharging the process liquid at the second discharge position may be provided separately, in place of the process-liquid nozzle moving device 108 for moving the process liquid nozzle 103.

First Modification of First Embodiment

Figure 9:
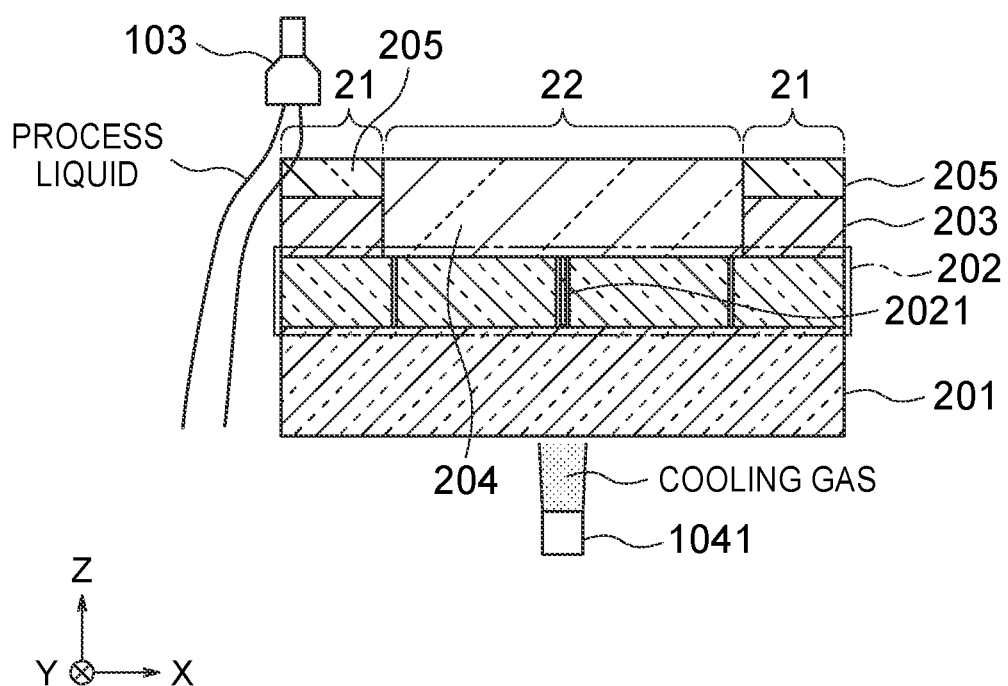
FIG. 9 is a cross-sectional view of a part of the substrate processing device according to a first modification of the first embodiment, illustrating an operation example of the substrate processing device.

Next, a first modification of the first embodiment, in which cooling of the substrate 2 is continued in the substrate static-electricity-neutralization process, is described, focusing on differences from the above-described example. FIG. 9 is a cross-sectional view of a part of the substrate processing device 1 according to the first modification of the first embodiment, illustrating an operation example of the substrate processing device 1.

FIGS. 5 and 8 have illustrated an example in which supply of a cooling gas to the substrate 2 is stopped in the substrate static-electricity-neutralization process. On the contrary, as illustrated in FIG. 9, the substrate processing device 1 may continue to supply the cooling gas to the substrate 2 with the cooling gas nozzle 104 in the substrate static-electricity-neutralization process.

According to the first modification of the first embodiment, the solidified film 204 on the second substrate region 22 can be prevented from melting in the substrate static-electricity-neutralization process, and hence defects caused by partial oxidation of the halftone film 202 can be reduced more effectively.

Second Modification of First Embodiment

Next, a second modification of the first embodiment, in which the solidified film 204 on the first substrate region 21 is caused to melt by a heating gas, is described, focusing on differences from the above-described example.

Figure 10:
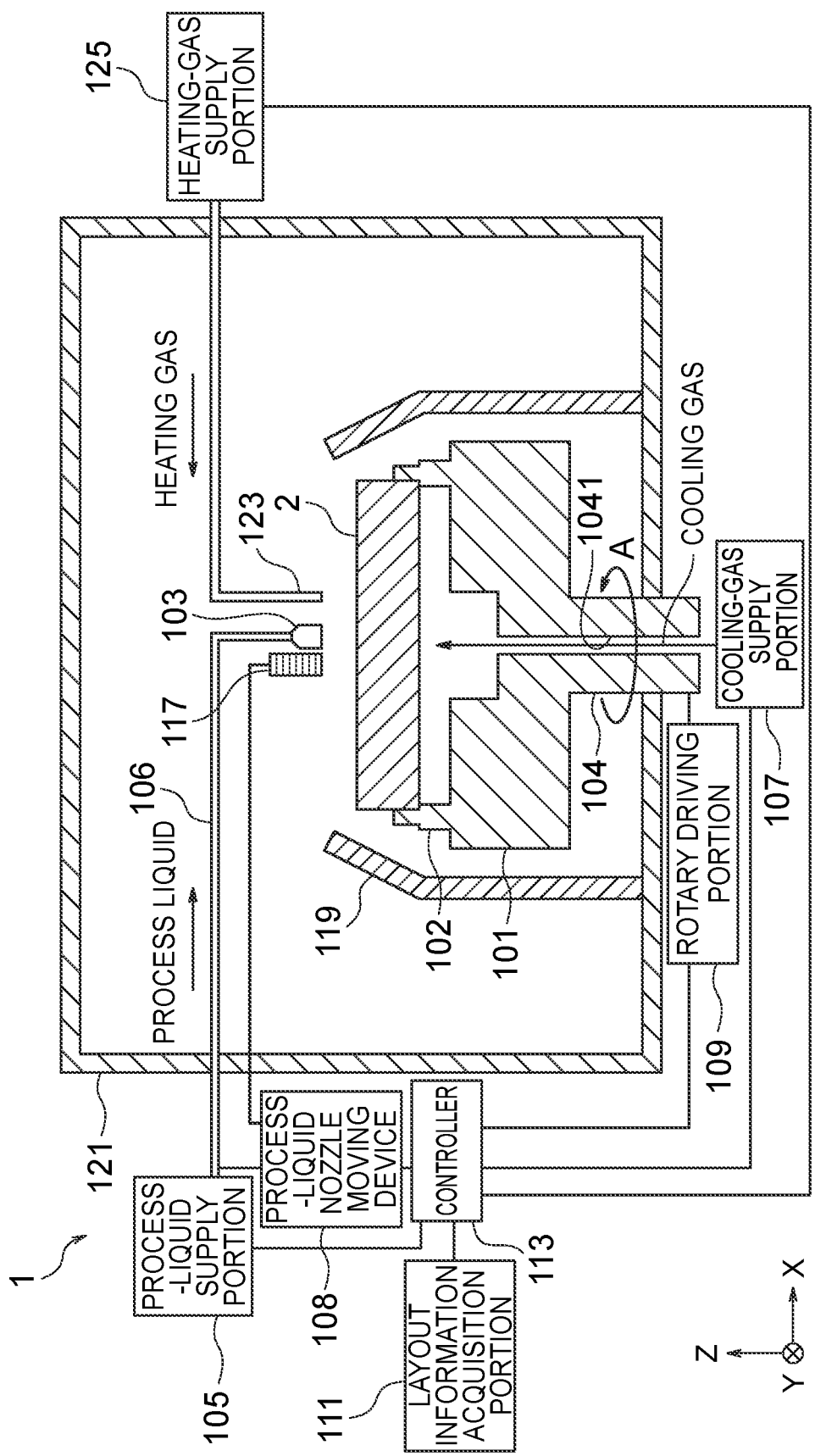
FIG. 10 is a diagram illustrating a substrate processing device according to a second modification of the first embodiment.

FIG. 10 is a diagram illustrating the substrate processing device 1 according to the second modification of the first embodiment. The substrate processing device 1 according to the second modification of the first embodiment includes a heating gas nozzle 123 and a heating-gas supply portion 125 in addition to the configuration in FIG. 1.

Figure 11:
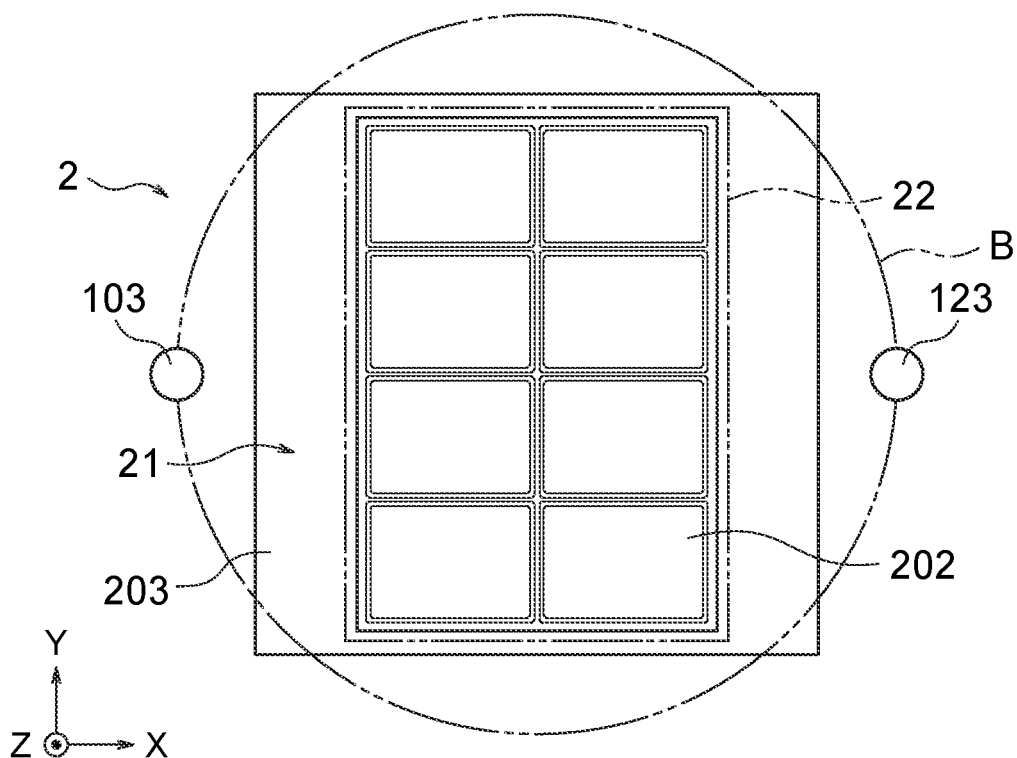
FIG. 11 is a plan view illustrating a part of the substrate processing device according to the second modification of the first embodiment.

The heating gas nozzle 123 is configured to supply a heating gas having a temperature equal to or higher than the melting point of the solidified film 204 to the solidified film 204 on the first substrate region 21. The heating gas is, for example, nitrogen gas. FIG. 11 is a plan view illustrating a part of the substrate processing device 1 according to the second modification of the first embodiment. As illustrated in FIG. 11, the heating gas nozzle 123 is arranged on the orbit B of rotation of the first substrate region 21 of the substrate 2. The heating gas nozzle 123 may be moved to the orbit B of rotation by a moving device (not illustrated). The heating gas nozzle 123 is connected to the heating-gas supply portion 125. The heating-gas supply portion 125 supplies a heating gas to the heating gas nozzle 123. The heating-gas supply portion 125 includes, for example, a reservoir tank storing therein the heating gas that is liquefied and a valve adjusting the flow rate of the heating gas supplied from the reservoir tank to the heating gas nozzle 123. The controller 113 controls the flow rate of the heating gas supplied by the heating-gas supply portion 125. The heating gas nozzle 123 discharges the heating gas supplied from the heating-gas supply portion 125 to the solidified film 204 on the first substrate region 21, thereby causing the solidified film 204 on the first substrate region 21 to melt.

Figure 12:
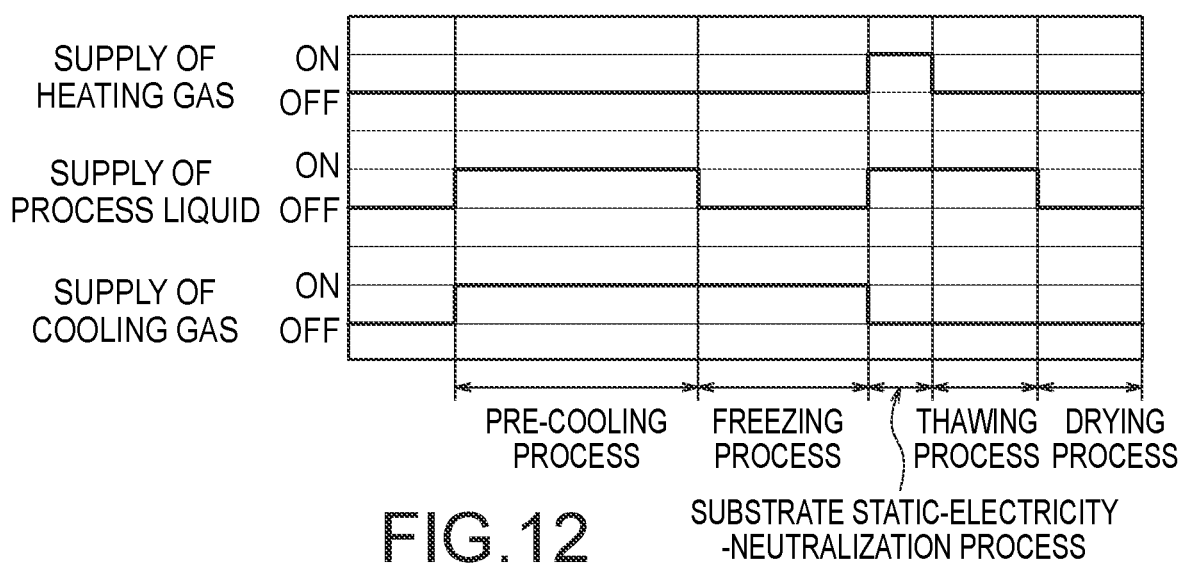
FIG. 12 is a timing chart illustrating an operation example of the substrate processing device according to the second modification of the first embodiment.
Figure 13:
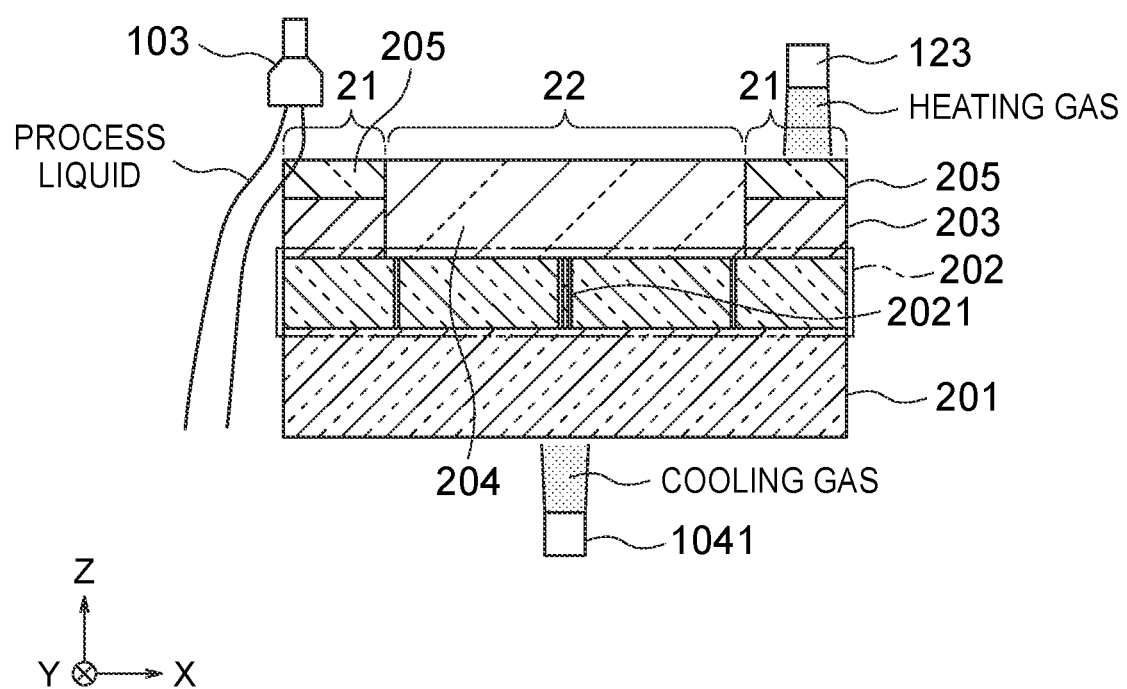
FIG. 13 is a cross-sectional view of a part of the substrate processing device according to the second modification of the first embodiment, illustrating the operation example of the substrate processing device.

FIG. 12 is a timing chart illustrating an operation example of the substrate processing device 1 according to the second modification of the first embodiment. FIG. 13 is a cross-sectional view of a part of the substrate processing device 1 according to the second modification of the first embodiment, illustrating the operation example of the substrate processing device 1. In the second modification of the first embodiment, as illustrated in FIG. 12, the controller 113 causes the process-liquid supply portion 105 to supply a process liquid (ON) and causes the heating-gas supply portion 125 to supply a heating gas (ON) in the substrate static-electricity-neutralization process. Consequently, as illustrated in FIG. 13, the process liquid supplied by the process-liquid supply portion 105 is discharged from the process liquid nozzle 103 to the solidified film 204 on the first substrate region 21, and the heating gas supplied by the heating-gas supply portion 125 is discharged from the heating gas nozzle 123 to the solidified film 204 on the first substrate region 21. In FIG. 12, supply of the cooling gas is stopped (OFF) in the substrate static-electricity-neutralization process. Supply of the cooling gas in the substrate static-electricity-neutralization process is not limited to being stopped. As illustrated in FIG. 13, supply of the cooling gas may be continued in the substrate static-electricity-neutralization process.

According to the second modification of the first embodiment, melting of the solidified film 204 on the first substrate region 21 can be promoted by a heating gas. Therefore, a time for processing the substrate 2 can be shortened as compared with a case of causing the solidified film 204 on the first substrate region 21 to melt by supply of a process liquid. Melting of the solidified film 204 on the first substrate region 21 may be achieved by supply of the heating gas only. In addition, when the heating gas nozzle 123 is configured to be movable to a position facing the solidified film 204 on the second substrate region 22, the heating gas can also be used for causing the solidified film 204 on the second substrate region 22 to melt.

Second Embodiment

Figure 14:
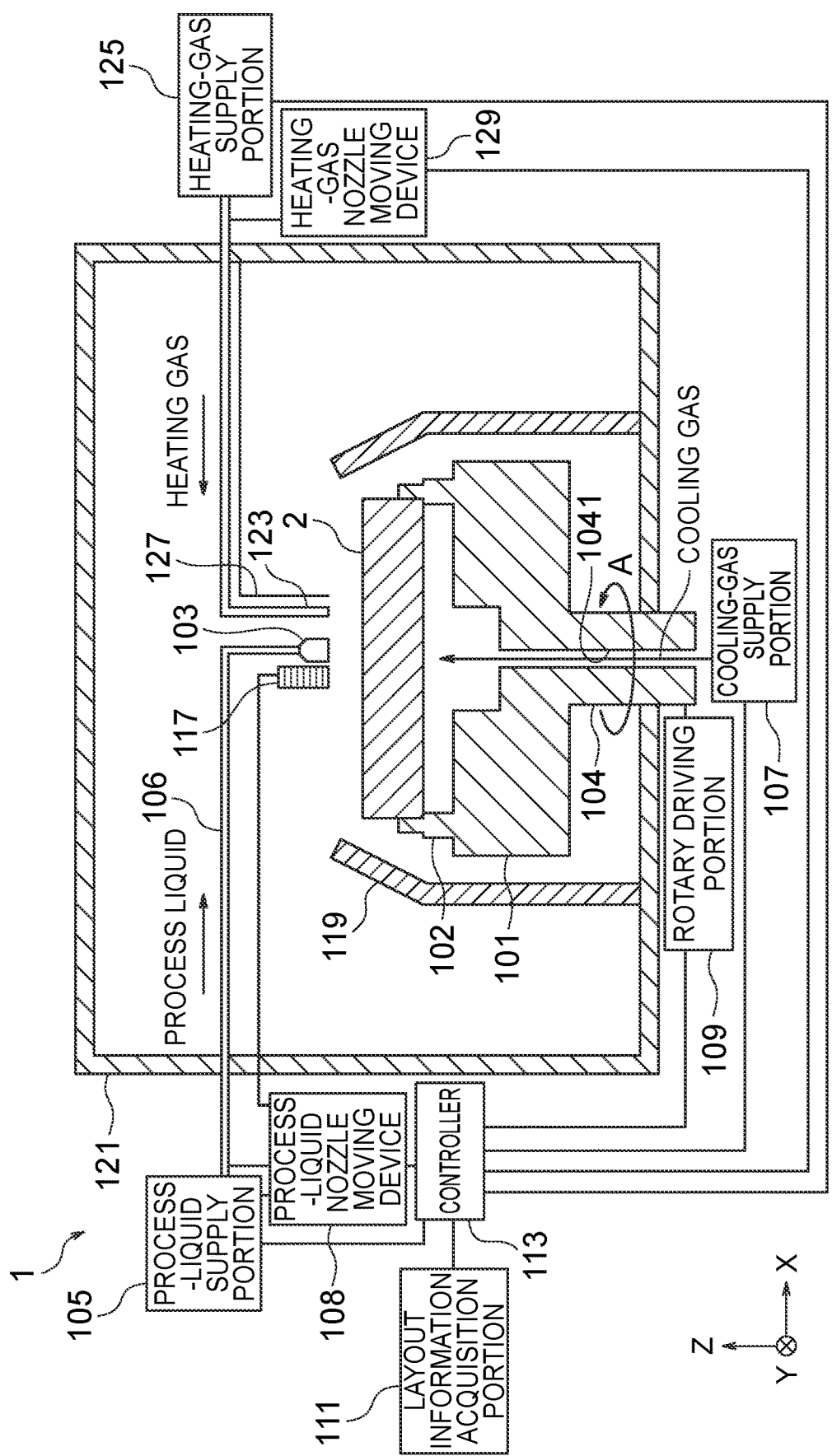
FIG. 14 is a diagram illustrating an example of a substrate processing device according to a second embodiment.

Next, a second embodiment in which static electricity of the substrate 2 is neutralized by using a grounding conductor is described, focusing on differences from the second modification of the first embodiment. FIG. 14 is a diagram illustrating an example of the substrate processing device 1 according to the second embodiment.

As illustrated in FIG. 14, the substrate processing device 1 according to the second embodiment includes a grounding conductor 127 and a heating-gas nozzle moving device 129 in addition to the configuration in FIG. 10. The grounding conductor 127 is provided on the heating gas nozzle 123. The grounding conductor 127 is connected to the ground potential. The heating-gas nozzle moving device 129 moves the grounding conductor 127 together with the heating gas nozzle 123 under control by the controller 113. The specific configuration of the heating-gas nozzle moving device 129 may be identical to the process-liquid nozzle moving device 108.

Figure 15:
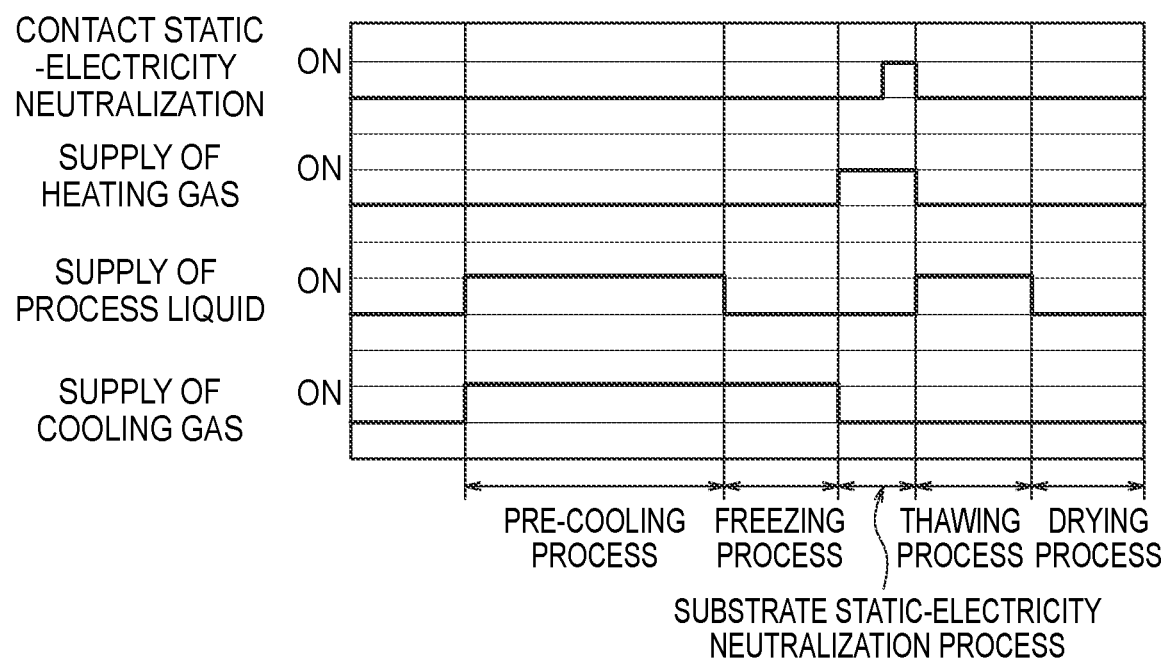
FIG. 15 is a timing chart illustrating an operation example of the substrate processing device according to the second embodiment.
Figure 16:
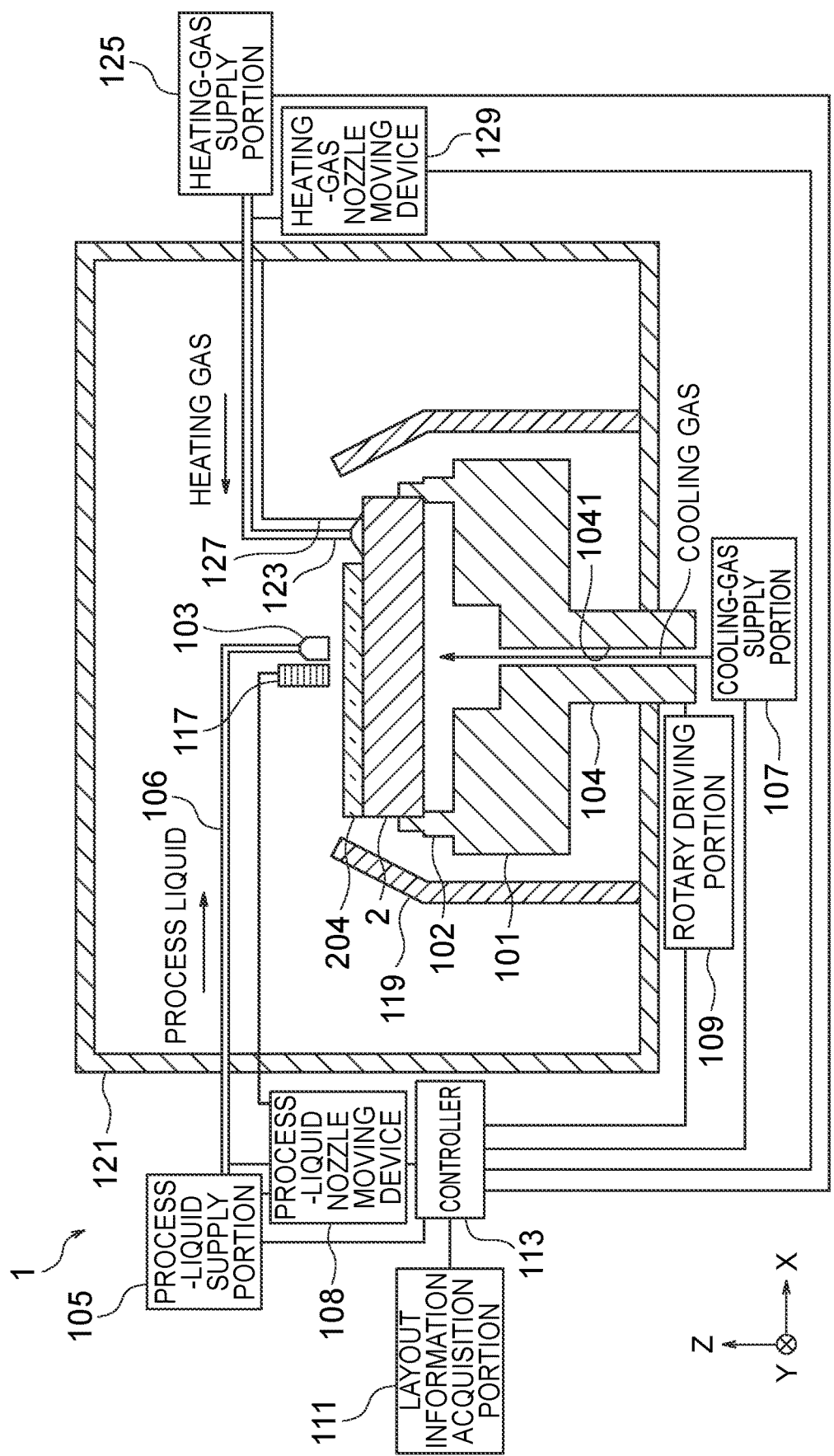
FIG. 16 is a diagram illustrating the operation example of the substrate processing device according to the second embodiment.

FIG. 15 is a timing chart illustrating an operation example of the substrate processing device 1 according to the second embodiment. FIG. 16 is a diagram illustrating the operation example of the substrate processing device 1 according to the second embodiment. In the second embodiment, as illustrated in FIG. 15, the substrate processing device 1 performs contact neutralization that neutralizes static electricity of the light shielding film 203 by bringing the grounding conductor 127 into contact with the light shielding film 203 in the substrate static-electricity-neutralization process. More specifically, in the substrate static-electricity-neutralization process, the controller 113 causes the heating-gas nozzle moving device 129 to move the heating gas nozzle 123 to a position facing the solidified film 204 on the first substrate region 21. The controller 113 then causes the heating-gas supply portion 125 to supply a heating gas (ON). Consequently, the heating gas supplied by the heating-gas supply portion 125 is discharged from the heating gas nozzle 123 to the solidified film 204 on the first substrate region 21. As melting of the solidified film 204 on the first substrate region 21 by the heating gas progresses, the heating-gas nozzle moving device 129 gradually moves down the heating gas nozzle 123. The speed at which the heating gas nozzle 123 is moved down may be a speed pre-set in accordance with the melting speed of the solidified film 204. Thereafter, when the grounding conductor 127 provided on the heating gas nozzle 123 has been moved by such an amount that the grounding conductor 127 comes into contact with the surface of the substrate 2 in the first substrate region 21 (that is, the light shielding film 203), the heating-gas nozzle moving device 129 stops moving down the heating gas nozzle 123. When the grounding conductor 127 comes into contact with the light shielding film 203, electric charges on the light shielding film 203 flow to the ground potential through the grounding conductor 127. Static electricity of the light shielding film 203 is thus neutralized.

If the grounding conductor 127 is brought into contact with the light shielding film 203 while the stage 101 is rotated, the light shielding film 203 may be damaged by the grounding conductor 127. In order to prevent the light shielding film 203 from being damaged, the controller 113 stops rotation of the stage 101 while the grounding conductor 127 is in contact with the light shielding film 203.

According to the second embodiment, static electricity of the light shielding film 203 can be neutralized quickly by using the grounding conductor 127. Consequently, a time for processing the substrate 2 can be shortened.

First Modification of Second Embodiment

Figure 17:
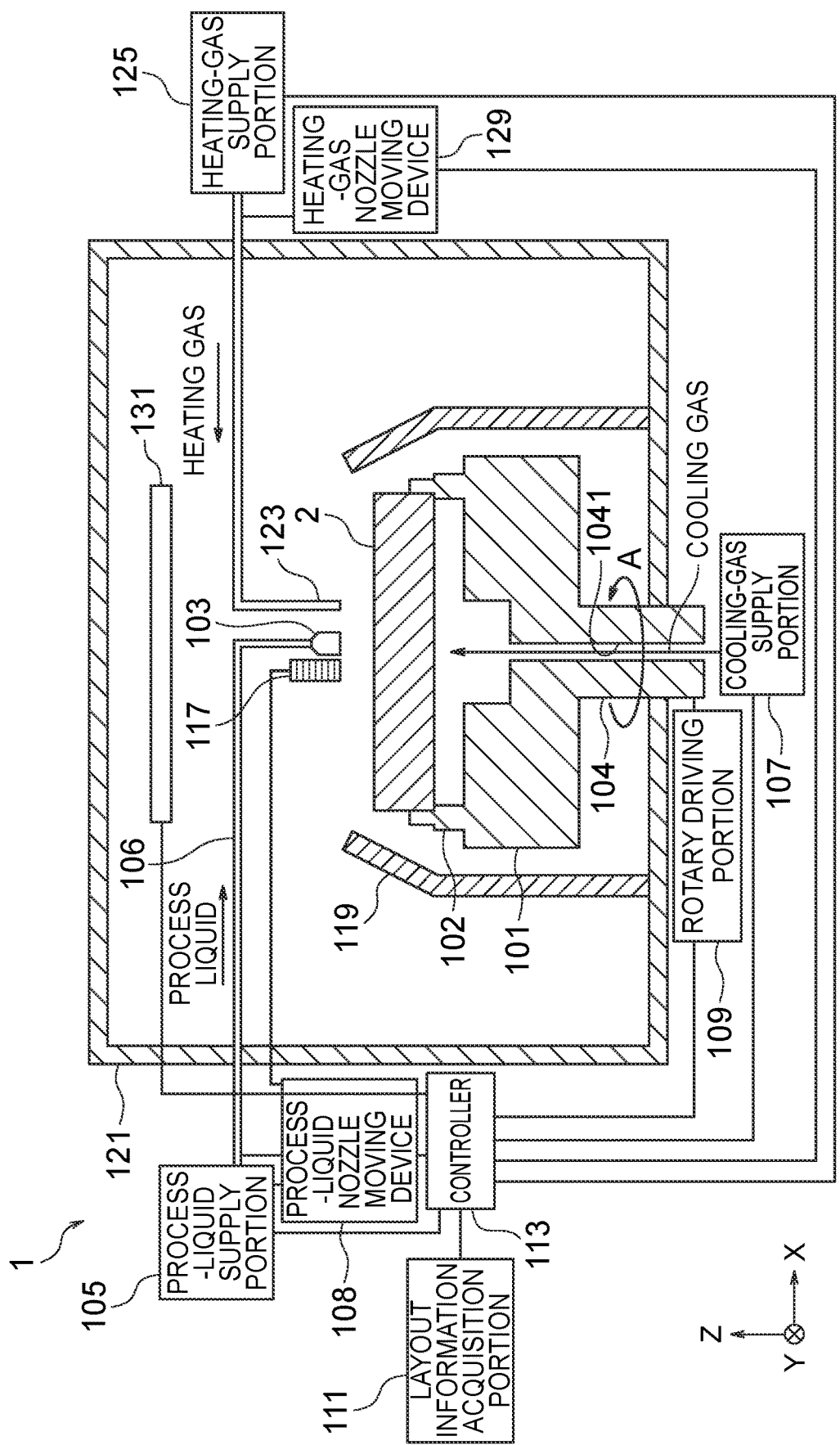
FIG. 17 is a diagram illustrating a substrate processing device according to a first modification of the second embodiment.

Next, a first modification of the second embodiment in which static electricity of the substrate 2 is neutralized by using an ionizer is described, focusing on differences from the configuration in FIG. 14. FIG. 17 is a diagram illustrating the substrate processing device 1 according to the first modification of the second embodiment.

As illustrated in FIG. 17, the substrate processing device 1 according to the first modification of the second embodiment includes an ionizer 131 in place of the grounding conductor 127, unlike FIG. 14. The ionizer 131 is a device that emits soft X-rays having an ionizing action to generate ions in an emitted range and removes static electricity from the substrate 2 by the generated ions. The controller 113 controls driving of the ionizer 131.

Figure 18:
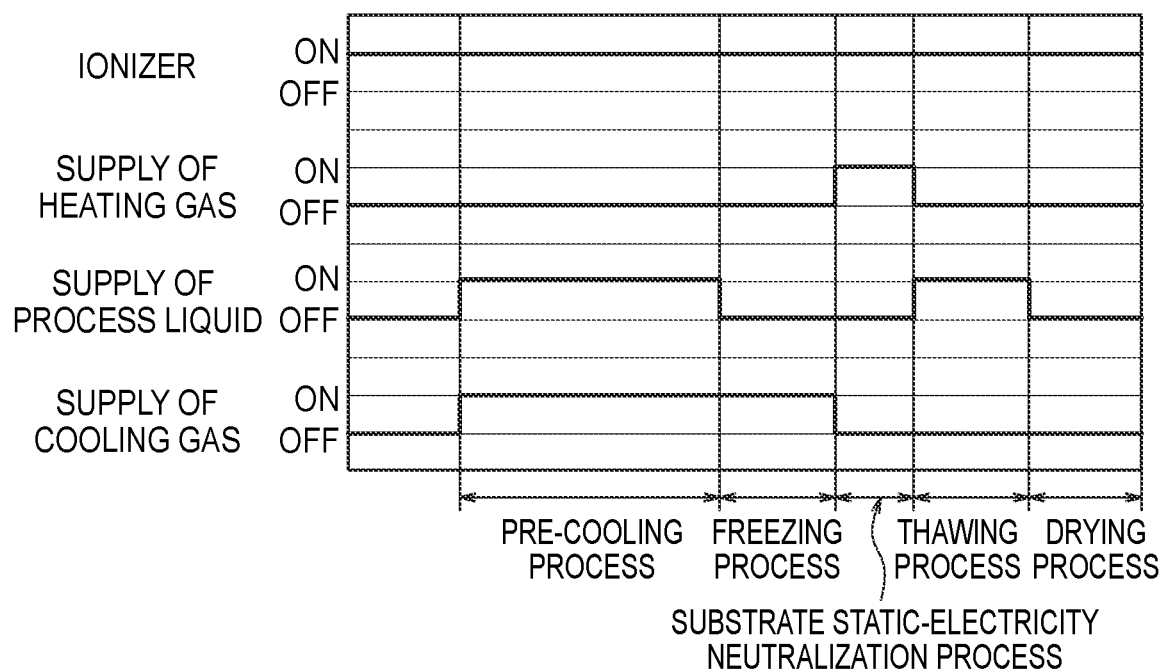
FIG. 18 is a timing chart illustrating an operation example of the substrate processing device according to the first modification of the second embodiment.

FIG. 18 is a timing chart illustrating an operation example of the substrate processing device 1 according to the first modification of the second embodiment. As illustrated in FIG. 18, in the first modification of the second embodiment, the controller 113 drives the ionizer 131 (ON) in all processes including the pre-cooling process, the freezing process, the substrate static-electricity-neutralization process, the thawing process, and the drying process. Consequently, static electricity of the light shielding film 203 exposed as a result of melting of the solidified film 204 on the first substrate region 21 by the heating gas can be neutralized by ions generated by the ionizer 131 in the substrate static-electricity-neutralization process. Further, electric charges on the substrate 2 can also be removed in processes other than the substrate static-electricity-neutralization process.

According to the first modification of the second embodiment, use of the ionizer 131 enables static electricity of the light shielding film 203 to be neutralized in a non-contact manner.

Second Modification of Second Embodiment

Figure 19:
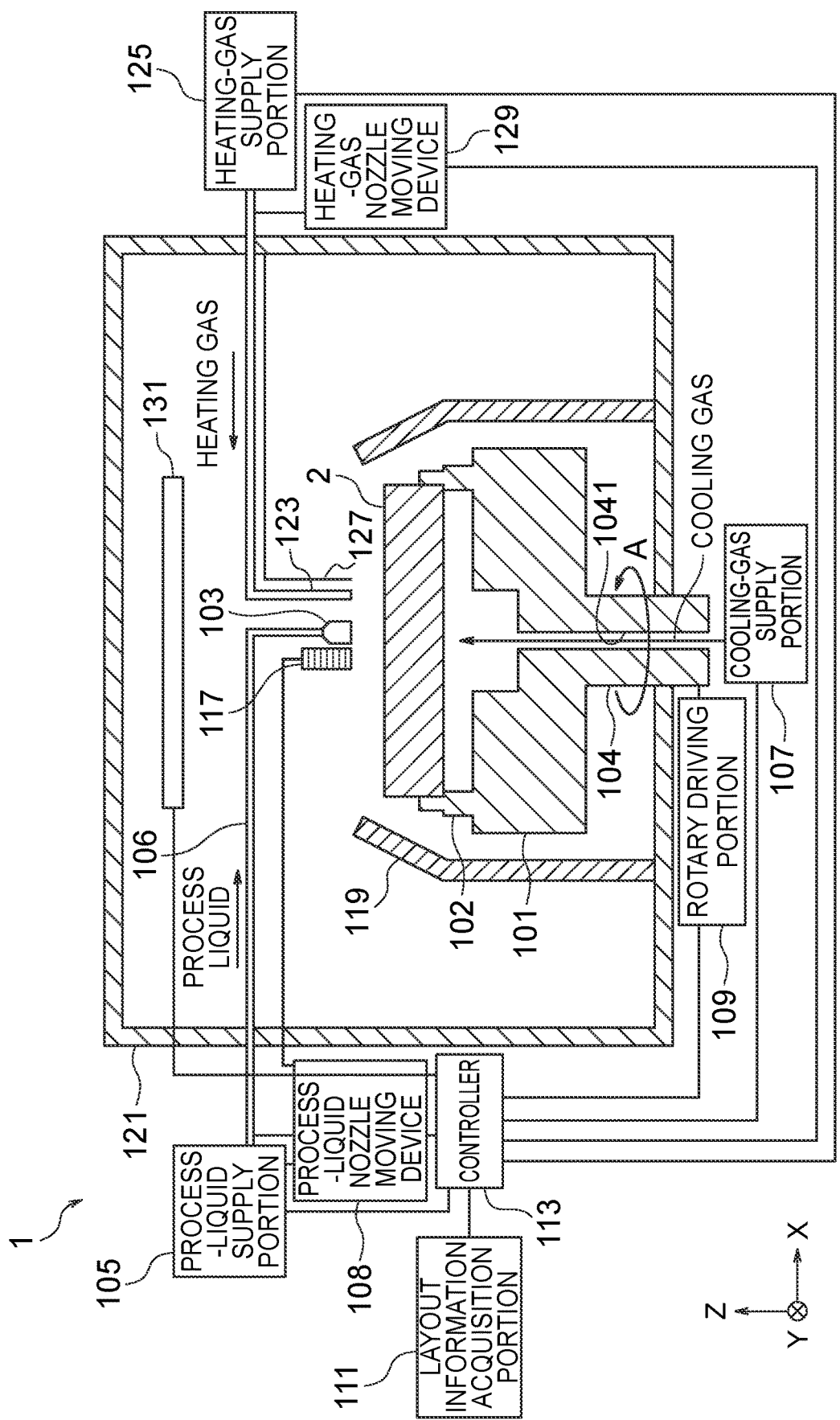
FIG. 19 is a diagram illustrating a substrate processing device according to a second modification of the second embodiment.

Next, a second modification of the second embodiment is described, in which static electricity of the substrate 2 is neutralized by using both the grounding conductor 127 and the ionizer 131. FIG. 19 is a diagram illustrating the substrate processing device 1 according to the second modification of the second embodiment. As illustrated in FIG. 19, the substrate processing device 1 according to the second modification of the second embodiment includes the grounding conductor 127 in addition to the configuration in FIG. 17 and neutralizes static electricity of the light shielding film 203 by using both the grounding conductor 127 and the ionizer 131. An operation of neutralizing static electricity of the light shielding film 203 using the grounding conductor 127 is identical to that in the example illustrated in FIG. 16.

Figure 20:
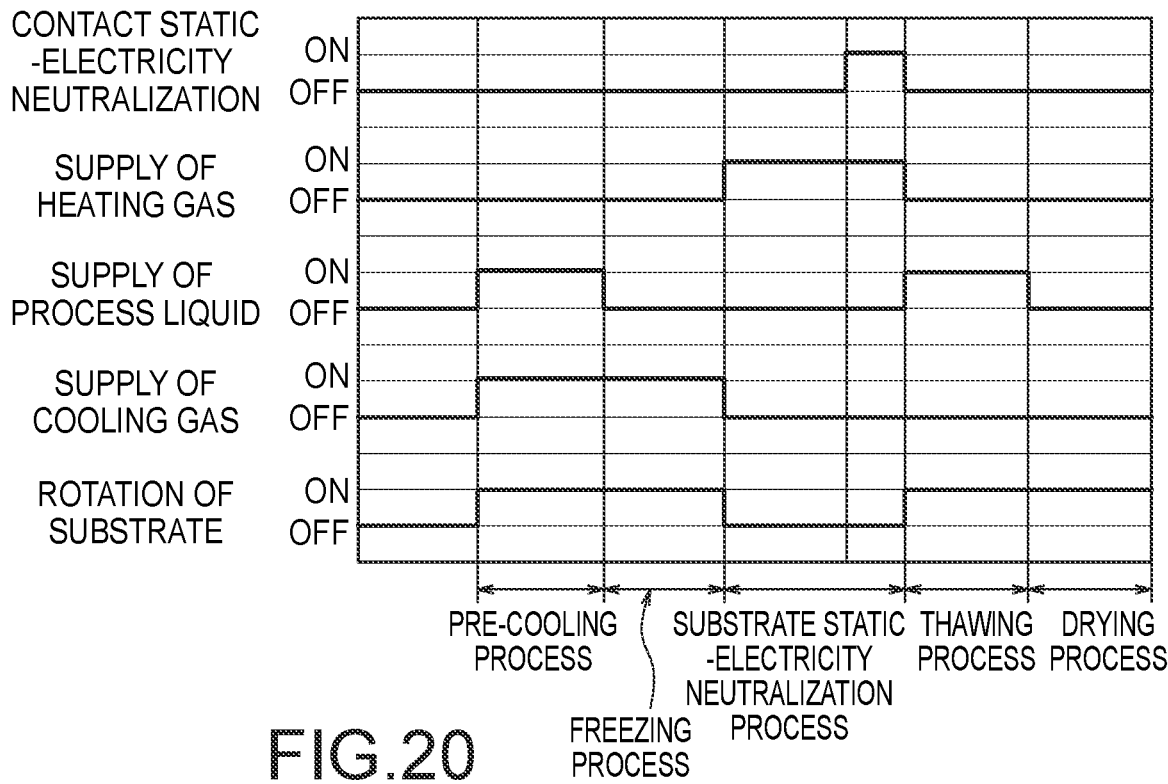
FIG. 20 is a timing chart illustrating an operation example of the substrate processing device according to the second modification of the second embodiment.

FIG. 20 is a timing chart illustrating an operation example of the substrate processing device 1 according to the second modification of the second embodiment. FIG. 18 has illustrated an example in which the ionizer 131 is driven in all the processes. Meanwhile, in the second modification of the second embodiment, static electricity of the light shielding film 203 is neutralized by using the grounding conductor 127 in addition to driving the ionizer 131 as illustrated in FIG. 20. In FIG. 20, the illustration of a timing chart of the ionizer 131 is omitted. Further, the stage 101 is rotated in the freezing process in the example illustrated in FIG. 20. In addition, the time period of the substrate static-electricity-neutralization process illustrated in FIG. 20 can be made shorter than the time period of the substrate static-electricity-neutralization process illustrated in each of FIGS. 15 and 18. In the second modification of the second embodiment, static electricity of the light shielding film 203 can be neutralized by using the grounding conductor 127 in addition to the ionizer 131, and hence can be neutralized quickly and appropriately.

Third Modification of Second Embodiment

Figure 21:
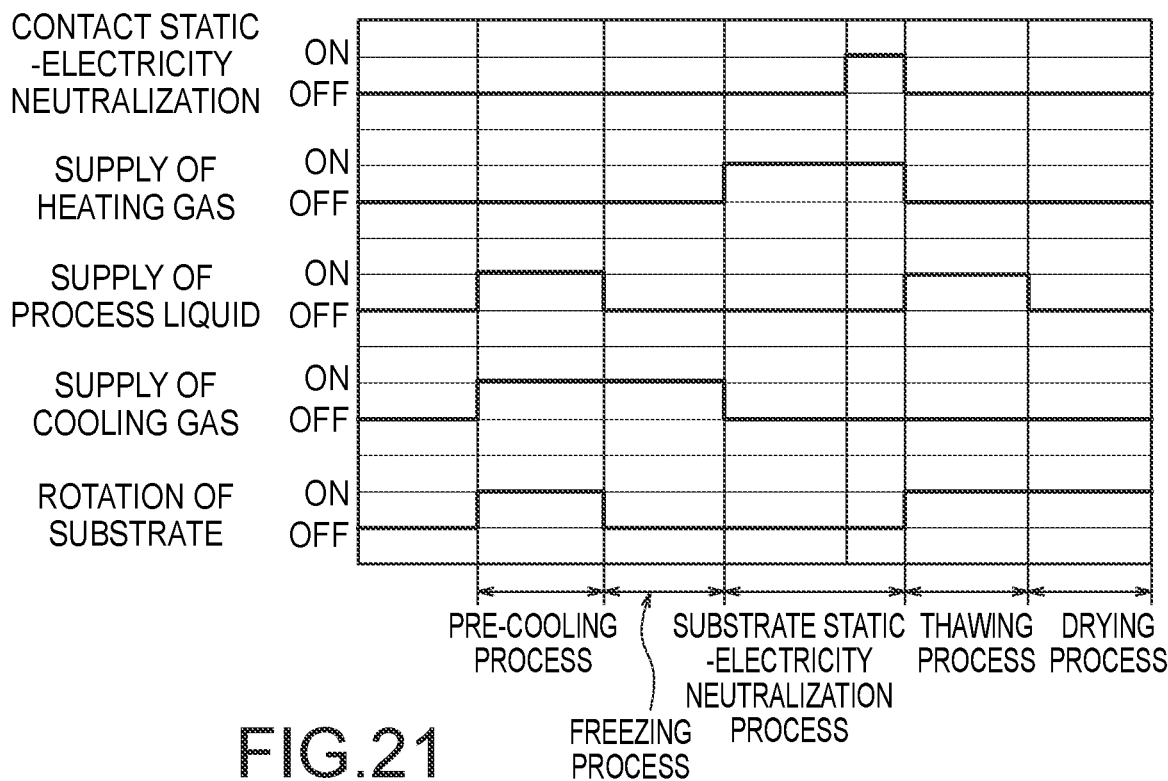
FIG. 21 is a timing chart illustrating an operation example of a substrate processing device according to a third modification of the second embodiment.

FIG. 21 is a timing chart illustrating an operation example of the substrate processing device 1 according to a third modification of the second embodiment. As illustrated in FIG. 21, the stage 101 may be stopped in the freezing process, unlike FIG. 20. By stopping the stage 101 in the freezing process, transfer of electric charges when the solidified film 204 is formed can be reduced. Accordingly, charging of the light shielding film 203, which may cause a defect, can be reduced.

Fourth Modification of Second Embodiment

Next, a fourth modification of the second embodiment in which the grounding conductor 127 is rotated together with the stage 101 is described, focusing on differences from the configuration in FIG. 19.

Figure 22:
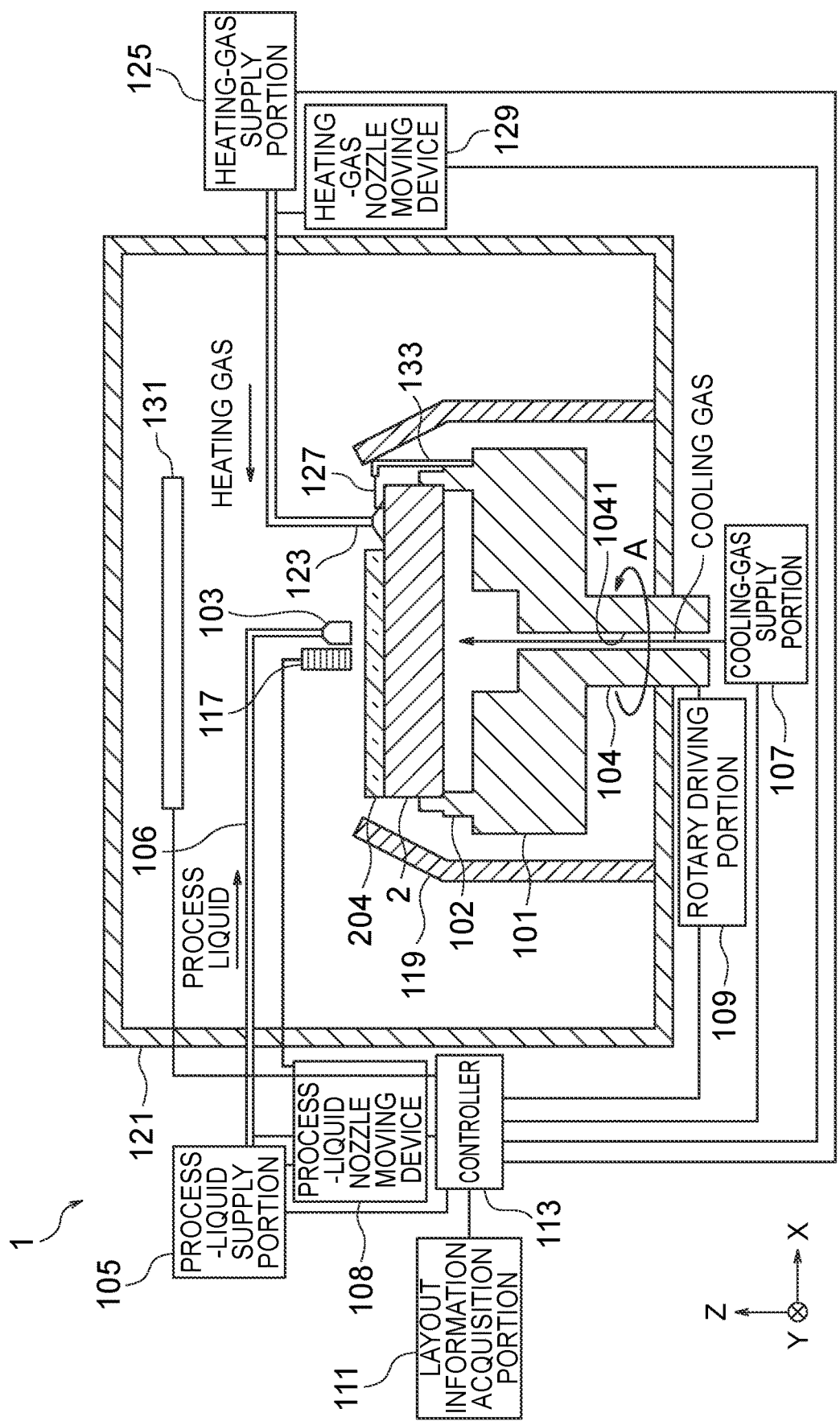
FIG. 22 is a diagram illustrating a substrate processing device according to a fourth modification of the second embodiment.

FIG. 22 is a diagram illustrating the substrate processing device 1 according to the fourth modification of the second embodiment. As illustrated in FIG. 22, the substrate processing device 1 according to the fourth modification of the second embodiment is different from the configuration in FIG. 19 in that the grounding conductor 127 is provided on the stage 101. In the example illustrated in FIG. 22, the grounding conductor 127 is provided outside the substrate support pins 102. The grounding conductor 127 can be rotated together with the stage 101. The grounding conductor 127 may be partially protected with a waterproof cover 133 in order to reduce deterioration of the grounding conductor 127 caused by a process liquid. The grounding conductor 127 may be configured to be always in contact with the outermost surface of the substrate 2. Alternatively, the grounding conductor 127 may be configured to be retracted from the outermost surface of the substrate 2 by a moving device (not illustrated) until the light shielding film 203 is exposed.

Figure 23:
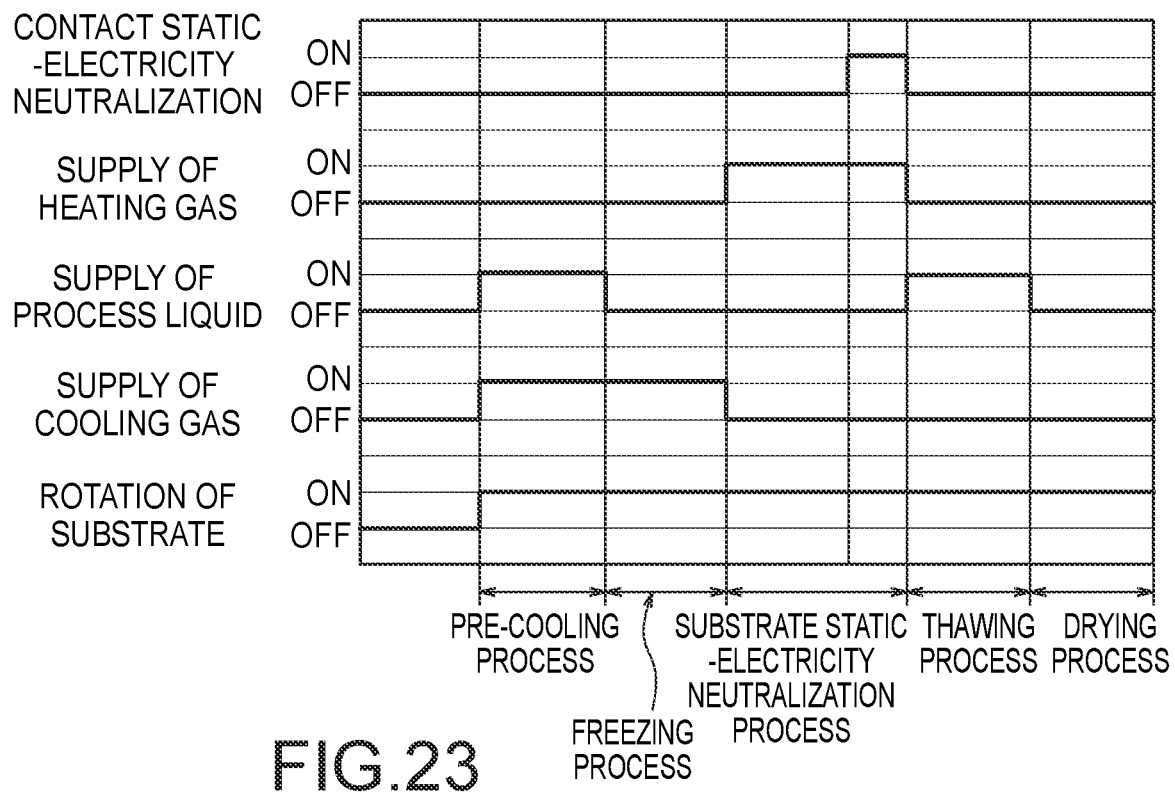
FIG. 23 is a timing chart illustrating an operation example of the substrate processing device according to the fourth modification of the second embodiment.

FIG. 23 is a timing chart illustrating an operation example of the substrate processing device 1 according to the fourth modification of the second embodiment. In the fourth modification of the second embodiment, as illustrated in FIG. 23, the controller 113 rotates the stage 101 in the substrate static-electricity-neutralization process. Since the grounding conductor 127 is rotated together with the stage 101 and the substrate 2 on the stage 101, the light shielding film 203 of the substrate 2 can be prevented from being damaged by the grounding conductor 127. Further, the controller 113 rotates the stage 101 also in the freezing process in the example illustrated in FIG. 23.

According to the fourth modification of the second embodiment, static electricity of the light shielding film 203 can efficiently be neutralized by both the grounding conductor 127 and the ionizer 131, as in the configuration in FIG. 19.

Fifth Modification of Second Embodiment

Figure 24:
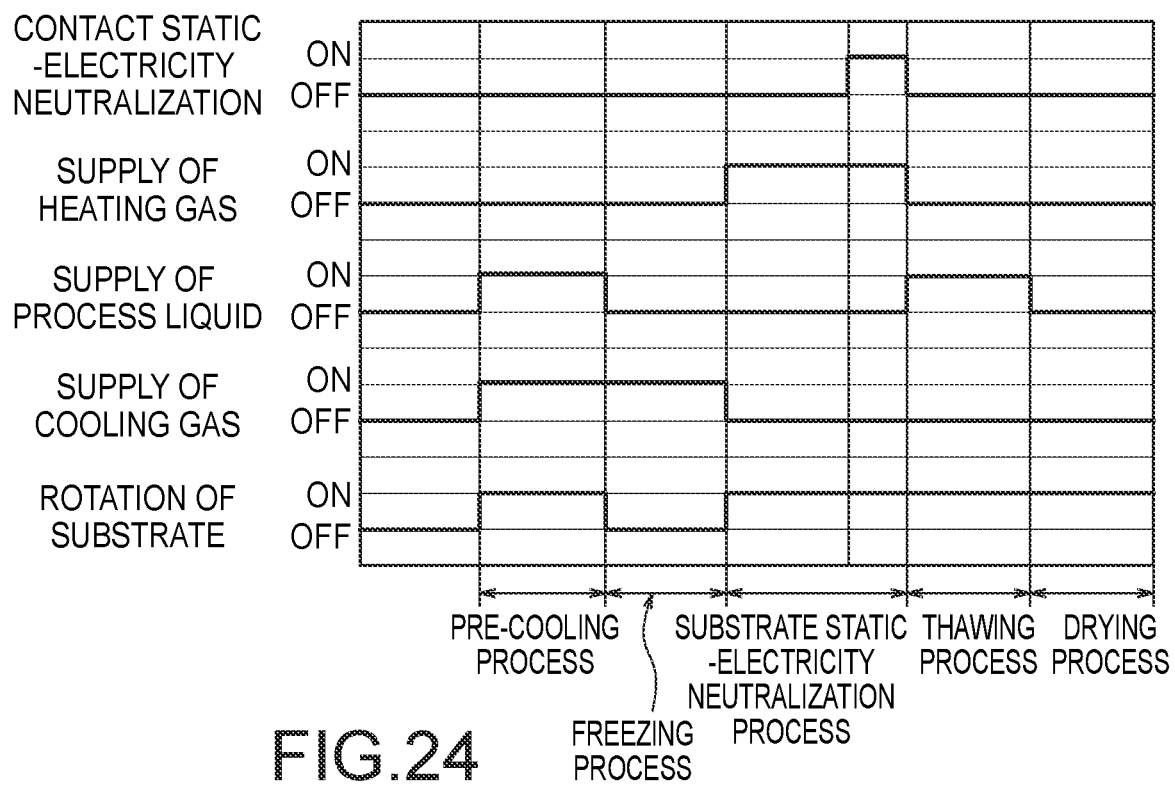
FIG. 24 is a timing chart illustrating an operation example of a substrate processing device according to a fifth modification of the second embodiment.

FIG. 24 is a timing chart illustrating an operation example of the substrate processing device 1 according to a fifth modification of the second embodiment. As illustrated in FIG. 24, rotation of the stage 101 may be stopped in the freezing process, unlike FIG. 23. By stopping the stage 101 in the freezing process, charging of the light shielding film 203, which causes a defect, can be reduced.

Third Embodiment

Figure 25:
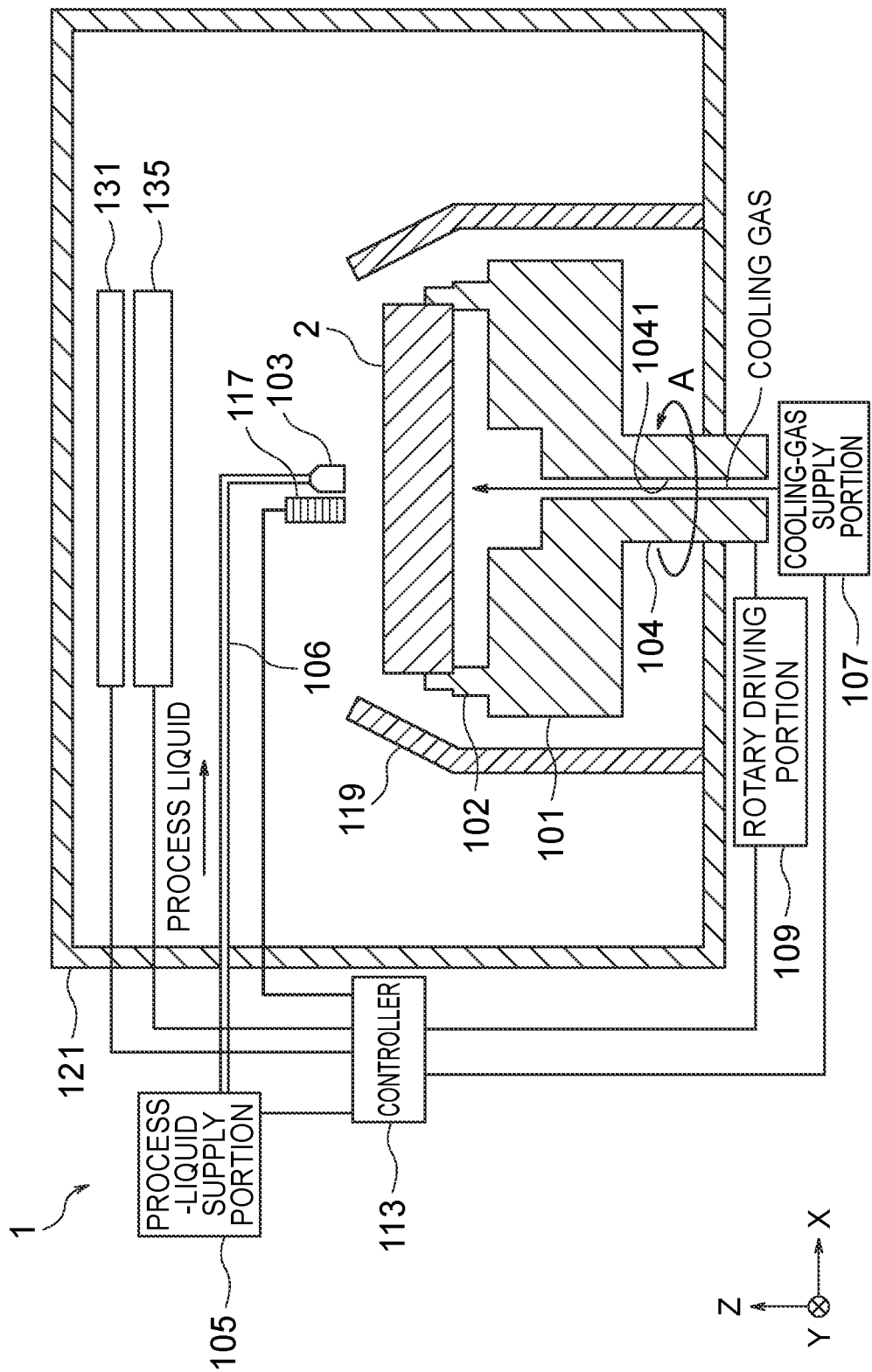
FIG. 25 is a diagram illustrating an example of a substrate processing device according to a third embodiment.
Figure 26:
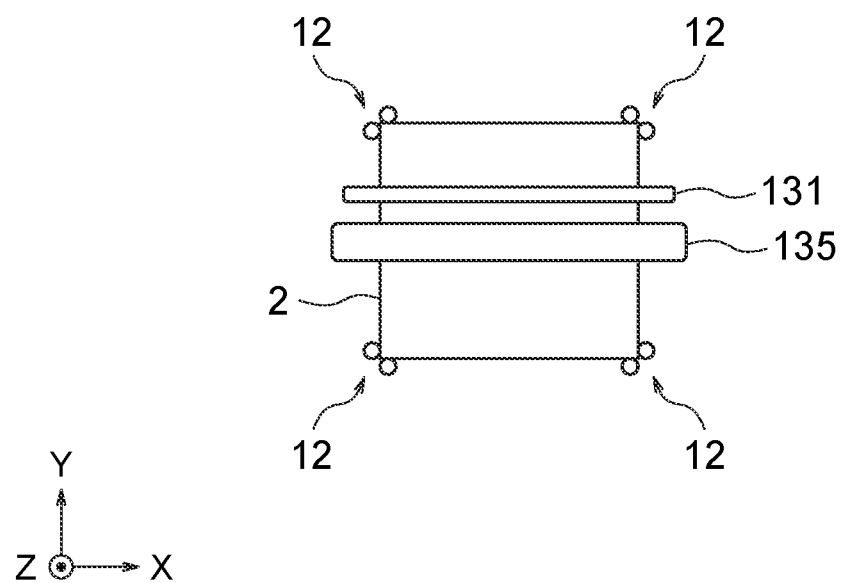
FIG. 26 is a plan view illustrating a part of the substrate processing device according to the third embodiment.

Next, a third embodiment in which the solidified film 204 is caused to melt by light irradiation is described, focusing on differences from the first and second embodiments. FIG. 25 is a diagram illustrating an example of the substrate processing device 1 according to the third embodiment. FIG. 26 is a plan view of a part of the substrate processing device 1 according to the third embodiment.

As illustrated in FIGS. 25 and 26, the substrate processing device 1 according to the third embodiment includes a lamp 135. The lamp 135 is, for example, a halogen lamp. The lamp 135 emits light with a wavelength absorbed in the light shielding film 203 onto the first substrate region 21, thereby causing the solidified film 204 on the first substrate region 21 to melt. The lamp 135 emits light with a wavelength in a range from about 700 to 2000 nm, for example. Light emitted from the lamp 135 may be infrared light. In the example illustrated in FIGS. 25 and 26, the lamp 135 is formed in the shape of a rod over the length crossing over (i.e., traversing) the substrate 2 along the X-axis direction.

The controller 113 controls light irradiation by the lamp 135. For example, the controller 113 may cause the lamp 135 to emit pulse-like light with a wavelength in a range from about 700 to 2000 nm a plurality of times at predetermined time intervals.

The light emitted from the lamp 135 is absorbed in the light shielding film 203 arranged in the first substrate region 21 and heats the light shielding film 203. When the light shielding film 203 is heated, the solidified film 204 on the first substrate region 21, which is in contact with the light shielding film 203, is caused to melt. Meanwhile, the light emitted from the lamp 135 is hardly absorbed in the halftone film 202 arranged in the second substrate region 22 and hardly heats the halftone film 202. Since the halftone film 202 is hardly heated, the solidified film 204 on the second substrate region 22, which is in contact with the halftone film 202, hardly melts. The solidified film 204 on the second substrate region 22 is caused to melt by a process liquid discharged from the process liquid nozzle 103 after completion of the substrate static-electricity-neutralization process using the ionizer 131. When the solidified film 204 on the first substrate region 21 is caused to melt by using the light 135, the process liquid supply nozzle 103 may be retracted to a retracted position by the process-liquid nozzle moving device 108 described above.

Also in the third embodiment, the solidified film 204 on the first substrate region 21 can be caused to melt prior to the solidified film 204 on the second substrate region 22, as in the first and second embodiments. Accordingly, defects caused by partial oxidation of the halftone film 202 located in the second substrate region 22 can be reduced.

First Modification of Third Embodiment

Figure 27:
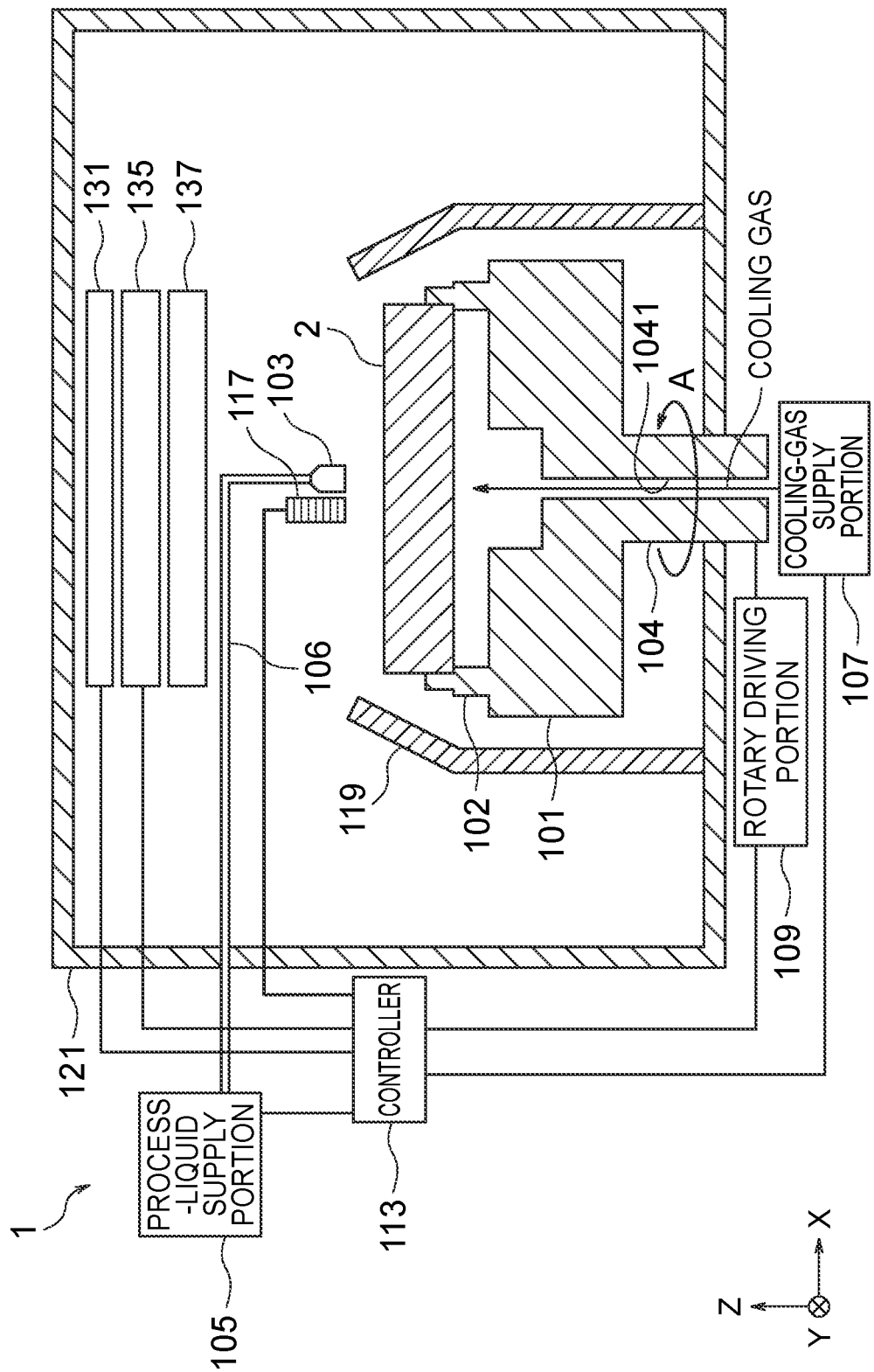
FIG. 27 is a diagram illustrating a substrate processing device according to a first modification of the third embodiment.

Next, a first modification of the third embodiment in which light absorption in the substrate 2 is inhibited by an element other than the light shielding film 203 is described, focusing on differences from the configuration in FIG. 25. FIG. 27 is a diagram illustrating the substrate processing device 1 according to the first modification of the third embodiment.

As illustrated in FIG. 27, the substrate processing device 1 according to the first modification of the third embodiment includes a filter 137 in addition to the configuration in FIG. 25. In the example illustrated in FIG. 27, the filter 137 has a plate shape. The filter 137 is arranged between the lamp 135 and the substrate 2. The lamp 135 emits light having a width of wavelength to the substrate 2.

The filter 137 is made of a material that is the same in absorption wavelength of light as at least one of the quartz substrate 201, the halftone film 202, and the solidified film 204. For example, the filter 137 may have a stacked structure of a layer made of a material the same as the quartz substrate 201, a layer made of a material the same as the halftone film 202, and a layer made of a material that is the same as or close to the solidified film 204 in absorption wavelength.

Figure 28:
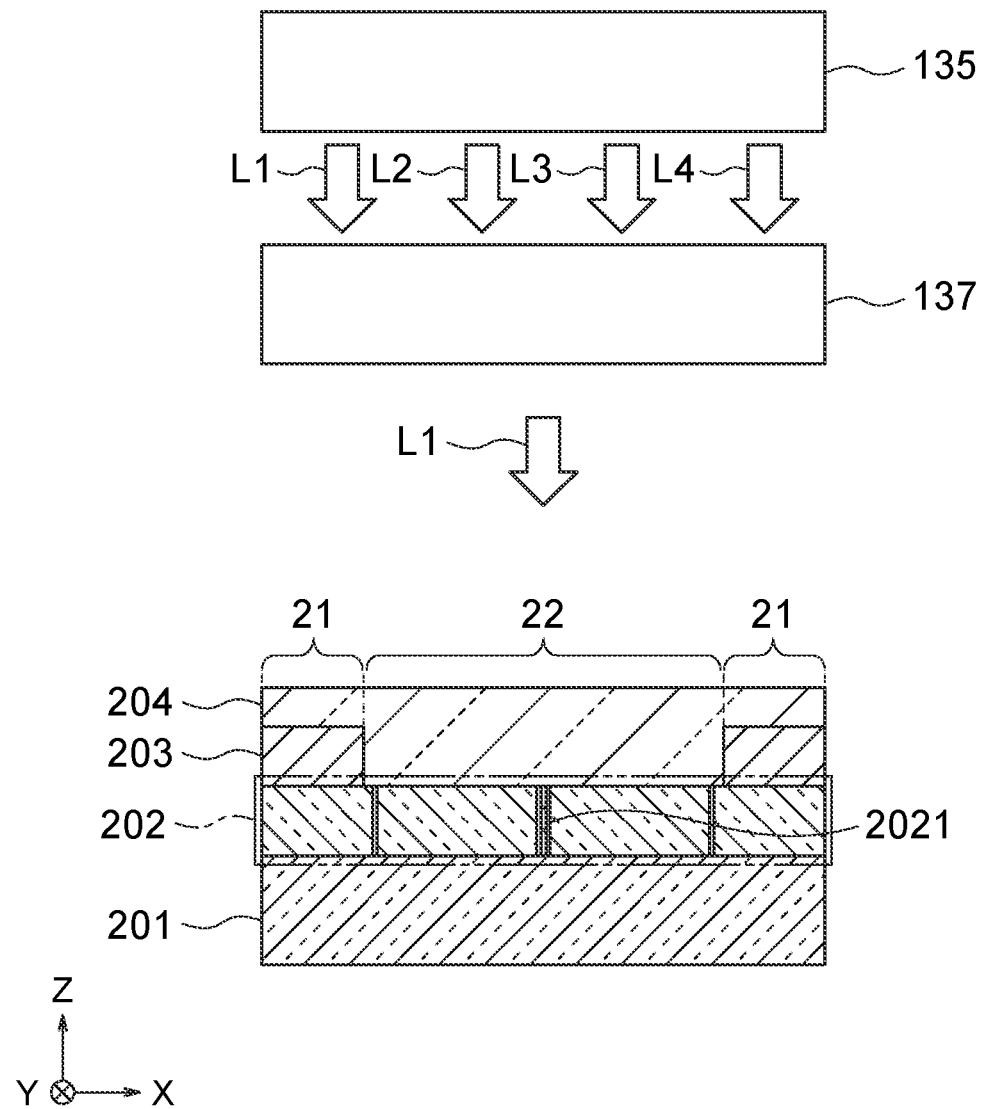
FIG. 28 is an explanatory diagram for an operation example of the substrate processing device according to the first modification of the third embodiment.

FIG. 28 is an explanatory diagram for an operation example of the substrate processing device 1 according to the first modification of the third embodiment. In the first modification of the third embodiment, as illustrated in FIG. 28, in light emitted from the lamp 135, light L2 for which the quartz substrate 201 has a high absorptance, light L3 for which the halftone film 202 has a high absorptance, and light L4 for which the solidified film 204 has a high absorptance are absorbed by the filter 137. That is, as for the light L2 to L4, the amount of light transmitted through the filter 137 is reduced, so that the amount of light incident on the substrate 2 is reduced. Meanwhile, light L1 well-absorbed by the light shielding film 203 is hardly absorbed by the filter 137, transmitted through the filter 137, and incident on the substrate 2. Therefore, the light L1 is absorbed in the light shielding film 203 arranged in the first substrate region 21, and the amount of absorbed light is reduced in the halftone film 202, the quartz substrate 201, and the solidified film 204 arranged in the second substrate region 22.

Therefore, according to the first modification of the third embodiment, absorption of light is inhibited in a portion other than the light shielding film 203, whereby the solidified film 204 on the first substrate region 21 can be caused to melt prior to the solidified film 204 on the second substrate region 22 more reliably. Accordingly, defects caused by partial oxidation of the halftone film 202 located in the second substrate region 22 can be reduced more effectively.

Second Modification of Third Embodiment

Figure 29:
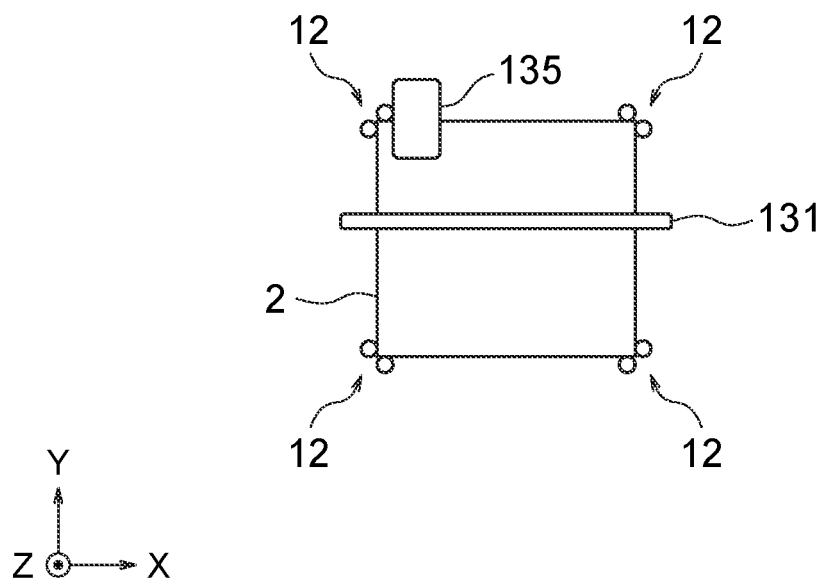
FIG. 29 is a plan view illustrating a part of a substrate processing device according to a second modification of the third embodiment.

FIG. 29 is a plan view illustrating a part of the substrate processing device 1 according to a second modification of the third embodiment. FIG. 26 has illustrated an example in which the lamp 135 is formed to have a length crossing over the substrate 2. However, as illustrated in FIG. 29, the lamp 135 may be formed to cover a part of the first substrate region 21 of the substrate 2. That is, the lamp 135 may be arranged on an orbit of rotation of the first substrate region 21. According to the second modification of the third embodiment, the lamp 135 can be downsized, so that the cost can be reduced.

Third Modification of Third Embodiment

Figure 30:
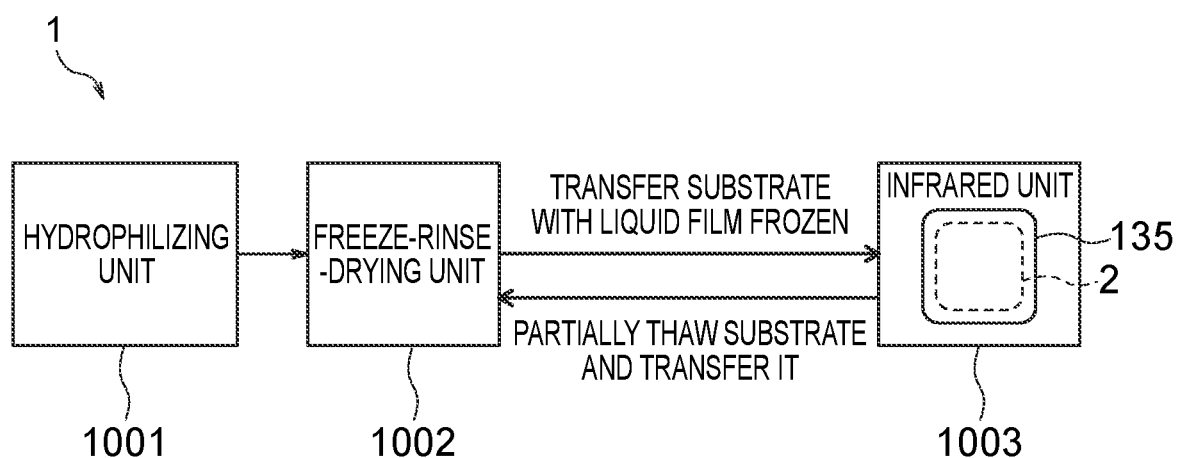
FIG. 30 is a block diagram illustrating a substrate processing device according to a third modification of the third embodiment.

FIG. 30 is a block diagram of the substrate processing device 1 according to a third modification of the third embodiment. An example in which respective processes of freeze cleaning are performed in one chamber has been described above. However, as illustrated in FIG. 30, respective processes of freeze cleaning may be divided and performed in a plurality of chambers. In the example illustrated in FIG. 30, the substrate processing device 1 includes a hydrophilizing unit 1001, a freeze-rinse-drying unit 1002, and an infrared unit 1003. Further, a substrate transfer mechanism (not illustrated) is provided between the hydrophilizing unit 1001, the freeze-rinse-drying unit 1002, and the infrared unit 1003 for transferring the substrate 2 between the units.

The hydrophilizing unit 1001 irradiates the surface of the substrate 2 with ultraviolet light prior to the above-described pre-cooling process, thereby improving the wettability of the substrate 2 by a process liquid.

The freeze-rinse-drying unit 1002 performs the pre-cooling process, the freezing process, the thawing process (rinsing process), and the drying process.

The infrared unit 1003 performs the above-described substrate static-electricity-neutralization process. That is, the substrate 2 with a liquid film frozen in the freezing process is transferred to the infrared unit 1003 while the liquid film remains frozen. The substrate 2 in which the solidified film 204 on the first substrate region 21 has been thawed (partially thawed) and subjected to static electricity neutralization in the infrared unit 1003 is then transferred to the freeze-rinse-drying unit 1002 in order to be subjected to the thawing process. Melting of the solidified film 204 on the first substrate region 21 in the substrate static-electricity-neutralization process is achieved by infrared irradiation.

According to the third modification of the third embodiment, by preforming respective processes of freeze cleaning in a plurality of chambers, it is possible to improve the flexibility in design in the respective processes.

Fourth Modification of Third Embodiment

Figure 31:
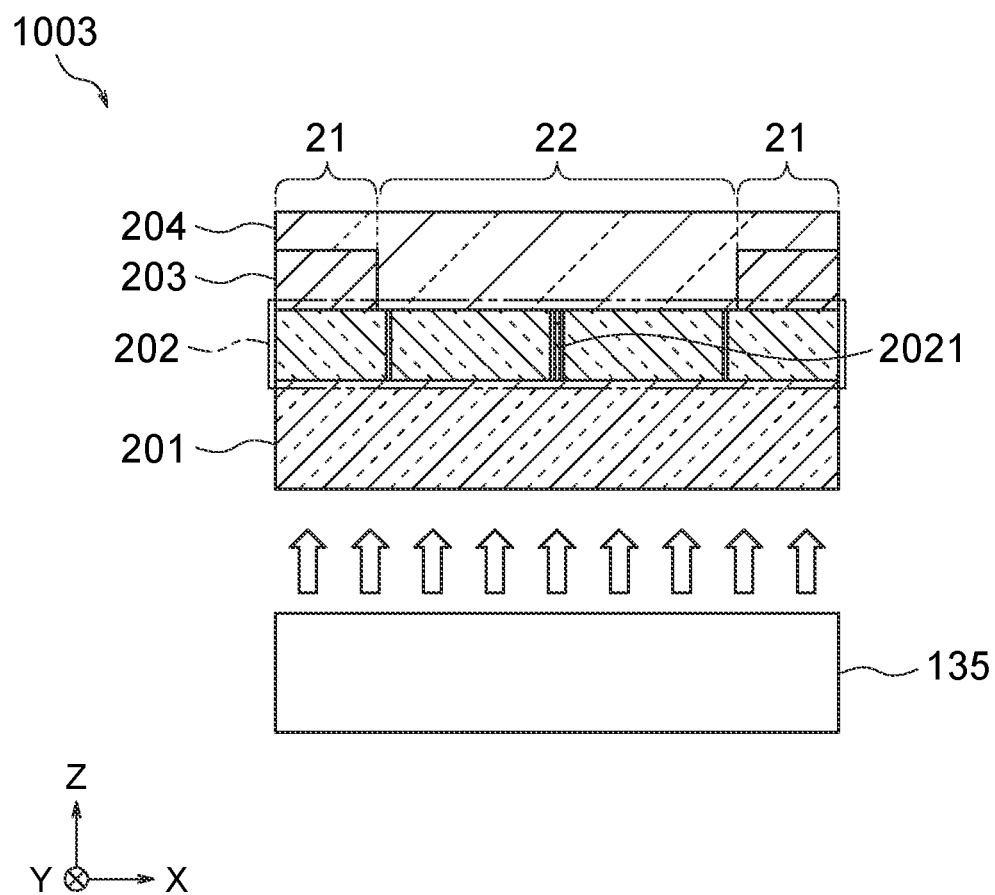
FIG. 31 is a diagram illustrating a part of a substrate processing device according to a fourth modification of the third embodiment.

FIG. 31 is a diagram illustrating a part of the substrate processing device 1 according to a fourth modification of the third embodiment. An example has been described above in which the substrate 2 is irradiated with infrared rays from the lamp 135 arranged above the substrate 2, whereby the solidified film 204 on the first substrate region 21 is caused to melt. On the contrary, in the infrared unit 1003, the lamp 135 may be arranged below the substrate 2 as illustrated in FIG. 31.

The present embodiment is not limited to static electricity neutralization of the substrate 2 described above, and may be used for neutralizing static electricity of a metal film on a substrate provided with a conductive frame-shaped metal film and a film made of a material different from the metal film and arranged in an island shape inside the metal film on an insulator such as quartz glass.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A substrate processing device comprising:
   a holding portion configured to hold a substrate including a first region provided with a first film on an outermost surface thereof and a second region provided with a second film on an outermost surface thereof, the first film and the second film being different from each other in material;

a rotation shaft connected to the holding portion;

a rotary driving portion connected to the rotation shaft, the rotary driving portion being configured to drive and rotate the rotation shaft and the holding portion;

a process liquid nozzle that faces the first side of the substrate and is movable to a first discharge position and a second discharge position, the first discharge position facing the first region of the substrate, and the second discharge position facing the second region of the substrate;

a cooling gas nozzle configured to supply a cooling gas to the substrate; and a processor which executes a program stored in a memory to perform operations including:

acquiring layout information on the substrate, the layout information including coordinates of the first region of the substrate;

controlling the device to form a liquid film on the substrate with liquid supplied through the process liquid nozzle;

controlling the device to solidify the liquid film by supplying the cooling gas through the cooling gas nozzle;

controlling the device to position the process liquid nozzle at the first discharge position based on the acquired coordinates of the first region of the substrate, and to supply liquid having a temperature equal to or higher than a melting point of the solidified liquid film, to the solidified liquid film from the process liquid nozzle while the holding portion is rotated.

2. The device of claim 1, further comprising a grounding conductor that is movable to contact the first film in the first region.

3. The device of claim 1, further comprising a light emitter configured to emit light having a wavelength absorbed in the first film, onto the first region.

4. The device of claim 1, wherein the processor executes the program stored in the memory to control the device to perform, in sequence:

(i) a pre-cooling process in which the liquid film is formed on the substrate, the pre-cooling process including supplying the liquid through the process liquid nozzle while supplying the cooling gas through the cooling gas nozzle;

(ii) a freezing process in which the liquid film is solidified, the freezing process including controlling supplying the cooling gas through the cooling gas nozzle, while not supplying any liquid through the process liquid nozzle;

(iii) a static-electricity-neutralization process that removes electric charges on the first film to reduce a potential difference between the first film and the second film, the static-electricity-neutralization process including positioning the process liquid nozzle at the first discharge position and supplying the liquid having a temperature equal to or higher than the melting point of the solidified liquid film, to the solidified liquid film from the process liquid nozzle while rotating the holding portion and while not supplying any cooling gas through the cooling gas nozzle; and (iv) a thawing process that thaws the solidified film on the second region, the thawing process including moving the process liquid nozzle from the first discharge position to the second discharge position and supplying the liquid having a temperature equal to or higher than the melting point of the solidified liquid film, to the solidified liquid film from the process liquid nozzle not supplying any cooling gas through the cooling gas nozzle.

5. The device of claim 1, wherein the first film contains chromium (Cr) and the second film contains molybdenum silicide (MoSi).

6. The device of claim 1, wherein the first discharge position is on an orbit of rotation of the first region.

7. The device of claim 1, further comprising an ionizer configured to emit soft X-rays having an ionizing action, to the substrate.

8. The device of claim 1, further comprising a heating gas nozzle configured to emit heating gas to the first region.

9. The device of claim 8, further comprising a grounding conductor provided on the heating gas nozzle, wherein the grounding conductor is configured to contact the first film in the first region.

10. The device of claim 1, wherein the process liquid nozzle and the cooling gas nozzle are positioned to be at opposite sides of the substrate.

11. The device of claim 10, wherein the cooling gas nozzle penetrates through a central portion of the rotations shaft.

* * * * *